(12) United States Patent
Myli et al.

(10) Patent No.: US 10,563,451 B2
(45) Date of Patent: *Feb. 18, 2020

(54) NICKEL-ALUMINUM BLOCKER FILM CONTROLLED TRANSMISSION COATING

(71) Applicant: Cardinal CG Company, Eden Prairie, MN (US)

(72) Inventors: Kari B. Myli, Sauk City, WI (US); Gary L. Pfaff, Cazenovia, WI (US); Daniel J. Plaggemeyer, Sauk City, WI (US)

(73) Assignee: CARDINAL CG COMPANY, Eden Prairie, MN (US)

( * ) Notice: Subject to any disclaimer, the term of this patent is extended or adjusted under 35 U.S.C. 154(b) by 96 days.

This patent is subject to a terminal disclaimer.

(21) Appl. No.: 15/667,696

(22) Filed: Aug. 3, 2017

(65) Prior Publication Data

US 2017/0328123 A1 Nov. 16, 2017

Related U.S. Application Data

(63) Continuation of application No. 14/663,616, filed on Mar. 20, 2015, now Pat. No. 9,752,377.

(51) Int. Cl.
*E06B 3/66* (2006.01)
*E06B 3/67* (2006.01)
(Continued)

(52) U.S. Cl.
CPC .............. *E06B 3/6612* (2013.01); *C01F 7/02* (2013.01); *C03C 3/087* (2013.01); *C03C 17/36* (2013.01); *C03C 17/366* (2013.01); *C03C 17/3613* (2013.01); *C03C 17/3639* (2013.01); *C03C 17/3642* (2013.01); *C03C 17/3644* (2013.01); *C03C 17/3689* (2013.01);
(Continued)

(58) Field of Classification Search
CPC ........ E06B 3/66; E06B 3/6612; E06B 3/6715; Y02B 80/22; Y02B 80/24; Y02A 30/25
See application file for complete search history.

(56) References Cited

U.S. PATENT DOCUMENTS 3,962,488 A 6/1976 Gillery
4,504,109 A 3/1985 De Busk et al.
(Continued)

FOREIGN PATENT DOCUMENTS

CN 103072341 A 5/2013
EP 1641722 A1 4/2006
(Continued)

OTHER PUBLICATIONS

Machine translation of applicant cited WO 2014/109368 (Year: 2014).*

(Continued)

*Primary Examiner* — Donald J Loney
(74) *Attorney, Agent, or Firm* — Fredrikson & Byron, P.A.

(57) ABSTRACT

The invention provides a glazing sheet and a low-emissivity coating on the glazing sheet. The low-emissivity coating comprises, in sequence moving outwardly from the glazing sheet, a layer comprising oxide film, nitride film, or oxynitride film, an infrared-reflective layer, a nickel-aluminum blocker layer, and an oxide layer. Also provided are methods of depositing such a low-emissivity coating.

27 Claims, 8 Drawing Sheets

(51) Int. Cl.
*C23C 14/18* (2006.01)
*C23C 14/35* (2006.01)
*C03C 17/36* (2006.01)
*E06B 3/82* (2006.01)
*C01F 7/02* (2006.01)
*C03C 3/087* (2006.01)
*C23C 16/30* (2006.01)
*E06B 3/663* (2006.01)
*E06B 3/70* (2006.01)

(52) U.S. Cl.
CPC .......... *C03C 17/3694* (2013.01); *C23C 14/18* (2013.01); *C23C 14/35* (2013.01); *C23C 16/308* (2013.01); *E06B 3/66* (2013.01); *E06B 3/6715* (2013.01); *E06B 3/822* (2013.01); *C03C 2218/365* (2013.01); *E06B 3/66314* (2013.01); *E06B 3/7001* (2013.01); *Y02A 30/25* (2018.01); *Y02B 80/22* (2013.01); *Y02B 80/24* (2013.01)

(56) References Cited

U.S. PATENT DOCUMENTS

| | | | |
|---|---|---|---|
| 4,583,815 A | 4/1986 | Taga et al. | |
| 4,790,922 A | 12/1988 | Huffer | |
| 4,806,220 A | 2/1989 | Finley | |
| 4,883,721 A | 11/1989 | Nalepka et al. | |
| 4,966,676 A | 10/1990 | Fukasawa et al. | |
| 4,976,503 A | 12/1990 | Woodard et al. | |
| 5,189,551 A | 2/1993 | Woodard | |
| 5,376,455 A | 12/1994 | Hartig et al. | |
| 5,595,825 A | 1/1997 | Guiselin | |
| 5,935,702 A | 8/1999 | MacQuart et al. | |
| 6,033,536 A | 3/2000 | Ichihara et al. | |
| 6,060,178 A | 5/2000 | Krisko | |
| 6,218,018 B1 | 4/2001 | McKown et al. | |
| 6,231,999 B1 | 5/2001 | Krisko | |
| 6,274,015 B1 | 8/2001 | Beier et al. | |
| 6,432,545 B1 | 8/2002 | Schicht et al. | |
| 6,555,250 B2 | 4/2003 | Shah et al. | |
| 6,645,358 B2 | 11/2003 | Lupton et al. | |
| 6,650,478 B1 | 11/2003 | De Busk et al. | |
| 6,919,133 B2 | 7/2005 | Hartig et al. | |
| 7,166,360 B2 | 1/2007 | Coustet et al. | |
| 7,211,328 B2 | 5/2007 | Schicht et al. | |
| 7,232,615 B2 | 6/2007 | Buhay et al. | |
| 7,572,509 B2 | 8/2009 | Hartig | |
| 7,572,510 B2 | 8/2009 | Hartig | |
| 7,572,511 B2 | 8/2009 | Hartig | |
| 8,088,473 B2 | 1/2012 | Hartig | |
| 8,286,395 B2 | 10/2012 | Mauvemay et al. | |
| 8,337,988 B2 | 12/2012 | Knoll et al. | |
| 8,420,207 B2 | 4/2013 | Reutler et al. | |
| 8,440,329 B2 | 5/2013 | Fleury et al. | |
| 8,551,300 B2 | 10/2013 | Stachowiak | |
| 8,586,215 B2 | 11/2013 | Hartig | |
| 9,028,956 B2 | 5/2015 | Knoll et al. | |
| 9,469,566 B2 | 10/2016 | Myli et al. | |
| 9,745,792 B2 * | 8/2017 | Myli .................... | E06B 3/6715 |
| 9,752,377 B2 * | 9/2017 | Myli .................... | E06B 3/6715 |
| 2003/0180547 A1 | 9/2003 | Buhay et al. | |
| 2004/0009356 A1 | 1/2004 | Medwick et al. | |
| 2004/0247929 A1 | 12/2004 | Buhay et al. | |
| 2005/0258029 A1 | 11/2005 | Muller et al. | |
| 2007/0081228 A1 * | 4/2007 | Hartig .................... | C03C 17/36 |
| | | | 359/359 |
| 2008/0223718 A1 | 9/2008 | Takagi et al. | |
| 2008/0280078 A1 | 11/2008 | Krisko et al. | |
| 2009/0176086 A1 | 7/2009 | Martin et al. | |
| 2010/0062245 A1 | 3/2010 | Martin et al. | |
| 2012/0107587 A1 | 5/2012 | Martin et al. | |
| 2012/0241316 A1 | 9/2012 | Arakawa | |
| 2013/0032477 A1 | 2/2013 | Yamakoshi et al. | |
| 2013/0114133 A1 | 5/2013 | Sado et al. | |
| 2013/0120842 A1 | 5/2013 | Moens et al. | |
| 2014/0268316 A1 | 9/2014 | Zhang et al. | |
| 2014/0272454 A1 | 9/2014 | Zhang et al. | |
| 2015/0140355 A1 | 5/2015 | Suzuki et al. | |
| 2016/0272537 A1 | 9/2016 | Myli et al. | |
| 2016/0273265 A1 | 9/2016 | Myli et al. | |
| 2017/0183256 A1 | 6/2017 | Myli et al. | |

FOREIGN PATENT DOCUMENTS

| | | |
|---|---|---|
| WO | 2012115850 A1 | 8/2012 |
| WO | 2014017448 A1 | 1/2014 |
| WO | 2014109368 A1 | 7/2014 |
| WO | 2014164989 A1 | 10/2014 |
| WO | 2014185420 A1 | 11/2014 |

OTHER PUBLICATIONS

International Patent Application No. PCT/US2016/021143, International Search Report & Written Opinion dated May 30, 2016, 10 pages.
U.S. Appl. No. 14/663,577, "Nickel-Aluminum Blocker Film Low-Emissivity Coatings," filed Mar. 20, 2015, 41 pages, now published as US Publication No. 2016/0272537, identified hereby as being a related application.
U.S. Appl. No. 14/663,644, "Nickel-Aluminum Blocker Film Multiple Cavity Controlled Transmission Coating," filed Mar. 20, 2015, 51 pages, now published as US Publication No. 2016/0273265, identified hereby as being a related application.
U.S. Appl. No. 15/241,593, "Nickel-Aluminum Blocker Film Low-Emissivity Coatings," filed Aug. 19, 2016, 40 pages, now published as US Publication No. 2016/0356931, identified hereby as being a related application.
U.S. Appl. No. 15/456,821, "Nickel-Aluminum Blocker Film Multiple Cavity Controlled Transmission Coating," filed Mar. 13, 2017, 46 pages, now published as US Publication No. 2017/0183256, identified hereby as being a related application.
U.S. Appl. No. 14/663,577, Non-Final Office Action dated Apr. 29, 2016, 19 pages.
U.S. Appl. No. 14/663,577, Notice of Allowance dated Sep. 8, 2016, 8 pages.
U.S. Appl. No. 14/663,577, Amendment and Response to Non-Final Office Action filed Jul. 27, 2016, 11 pages.
U.S. Appl. No. 14/663,644, Non-Final Office Action dated Feb. 27, 2017, 11 pages.
U.S. Appl. No. 14/663,644, Response to Non-Final Office Action filed May 2, 2017, 11 pages.
U.S. Appl. No. 14/663,644, Notice of Allowance dated Jul. 11, 2017, 8 pages.
Partial English translation of International Patent Publication WO 2014/109368, published Jul. 17, 2014, 6 pages.
Machine translation of International Patent Publication WO 2014/109368, published Jul. 17, 2014, 8 pages.
U.S. Appl. No. 15/241,593, Notice of Allowance dated Jul. 20, 2018, 10 pages.
U.S. Appl. No. 15/241,593, Corrected Notice of Allowance dated Aug. 7, 2018, 6 pages.
U.S. Appl. No. 14/663,577, "Nickel-Aluminum Blocker Film Low-Emissivity Coatings," filed Mar. 20, 2015, 41 pages, published as U.S. Publication No. 2016-0272537 on Sep. 22, 2016, and issued as U.S. Pat. No. 9,469,566 on Oct. 18, 2016, identified hereby as being a related application.
U.S. Appl. No. 15/456,821, "Nickel-Aluminum Blocker Film Multiple Cavity Controlled Transmission Coating ," filed Mar. 13, 2017, 46 pages, published as U.S. Publication No. 2017-0183256 on Jun. 29, 2017, and identified hereby as being a related application.
U.S. Appl. No. 14/663,644, "Nickel-Aluminum Blocker Film Multiple Cavity Controlled Transmission Coating," filed Mar. 20, 2015, 51 pages, published as U.S. Publication No. 2016-0273265 on Sep. 22, 2016, issued as U.S. Pat. No. 9,745,792 on Aug. 29, 2017, identified hereby as being a related application.
U.S. Appl. No. 15/456,821, Non-Final Office Action dated Jan. 28, 2019, 11 pages.

(56) References Cited

OTHER PUBLICATIONS

U.S. Appl. No. 15/456,821, Amendment and Response to Non-Final Office Action filed May 28, 2019, 10 pages.
U.S. Appl. No. 15/456,821, Notice of Allowance dated Aug. 7, 2019, 8 pages.
U.S. Appl. No. 14/663,644, Comments on Statement of Reasons for Allowance filed Jul. 21, 2017, 2 pages.
U.S. Appl. No. 15/456,821, Comments on Statement of Reasons for Allowance filed Aug. 27, 2019, 2 pages.
U.S. Appl. No. 14/663,616, "Nickel-Aluminum Blocker Film Controlled Transmission Coating," filed Mar. 20, 2015, 48 pages, published as U.S. Publication No. 2016-0273264 on Sep. 22, 2016, and issued as U.S. Pat. No. 9,752,377 on Sep. 5, 2017, identified hereby as being a related application.
U.S. Appl. No. 14/663,616, Non-Final Office Action dated Feb. 28, 2017, 12 pages.
U.S. Appl. No. 14/663,616, Response to Non-Final Office Action filed May 2, 2017, 11 pages.
U.S. Appl. No. 14/663,616, Notice of Allowance dated Jul. 6, 2017, 8 pages.
U.S. Appl. No. 14/663,616, Comments on Statement of Reasons for Allowance filed Jul. 21, 2017, 2 pages.

* cited by examiner

NICKEL-ALUMINUM BLOCKER FILM CONTROLLED TRANSMISSION COATING

RELATED APPLICATIONS

This application is a continuation of U.S. patent application Ser. No. 14/663,616, filed Mar. 20, 2015, the teachings of which are incorporated herein by reference.

FIELD OF THE INVENTION

The present invention relates to thin film coatings for glass and other substrates. In particular, this invention relates to controlled transmission coatings that are used on insulating glass units, laminated glass assemblies, and other glazing assemblies. Also provided are methods and equipment for producing such coatings and glazing assemblies.

BACKGROUND OF THE INVENTION

Glass sheets and other substrates can be coated with a stack of transparent, metal-containing films to vary the properties of the coated substrates. Particularly desirable are coatings characterized by their ability to transmit visible light while reducing the transmittance of other wavelengths of radiation, especially radiation in the infrared spectrum. These characteristics are useful for minimizing radiative heat transfer while controlling visible transmission. Coated glass of this nature is useful as architectural glass and as automotive glass.

Low-emissivity coatings and other controlled transmission coatings typically include one or more infrared-reflective films and two or more antireflective transparent dielectric films. The infrared-reflective films reduce the transmission of radiant heat through the coating. The infrared-reflective films commonly are conductive metals (e.g., silver, gold, or copper), although transparent conductive oxides (e.g., ITO) or conductive nitrides (e.g., TiN) may also be used. The transparent dielectric films are used primarily to reduce visible reflection, to provide mechanical and chemical protection for the sensitive infrared-reflective films, and to control other optical coating properties, such as color. Commonly used transparent dielectrics include oxides of zinc, tin, and titanium, as well as nitrides and oxynitrides of silicon. Such coatings can be deposited on glass sheets through the use of well-known magnetron sputtering techniques.

It is known to deposit a thin metallic layer directly over an infrared-reflective silver film to protect the silver film during deposition of a subsequent dielectric layer and/or during tempering or any other heat treatment. These protective layers (sometimes called "sacrificial layers" or "blocker layers") have been formed of various materials, such as titanium, niobium, niobium-titanium, or NiCr.

The particular material from which the blocker layer is formed impacts various properties and characteristics of the coating. Titanium blocker layers, for example, have been found to impart excellent scratch resistance in low-emissivity coatings. They also adhere well to both an underlying silver film and an overlying oxide film. Niobium has been found to be an advantageous blocker layer material as well. In addition, niobium-titanium has been found to be particularly beneficial in certain respects.

It is sometimes necessary to heat coated glass sheets to temperatures at or near the softening point of glass (726 degrees C.), e.g., to temper the glass or enable it to be bent into desired shapes. Tempering is important for glass used in automobile windows, and particularly for glass used in automobile windshields, as well as in various architectural glazing applications. Upon breaking, tempered glass exhibits a break pattern in which the glass shatters into many small pieces, rather than into large dangerous shards. During tempering, coated glass is typically subjected to elevated temperatures on the order of about 700 degrees C. Moreover, the coated glass must be able to withstand such temperatures for substantial periods of time. Certain film stacks having silver as the infrared-reflective film are not able to withstand such high temperature processing without unacceptable deterioration of the silver film.

To avoid this problem, glass sheets can be heated (e.g., bent or tempered) before they are coated. The desired films can then be applied after heating. This procedure, however, tends to be complicated and costly and, more problematically, may produce non-uniform coatings.

In many cases, it is desirable for temperable low-emissivity coatings to have only an upper blocker layer (i.e., without any lower blocker layer). In other cases, a reflective silver film is protected from deterioration at high temperatures by sandwiching the silver between two metallic blocker layers. In such cases, the two blocker layers are thick enough and reactive enough that when the coated glass is heated to high temperatures, these films capture oxygen and/or nitrogen that would otherwise reach and react with the silver.

In addition to the infrared reflection provided by low-emissivity coatings, these coatings can provide desired shading properties. As is well known, the solar heat gain coefficient (SHGC) of a window is the fraction of incident solar radiation that is admitted through a window. There are a number of applications where low solar heat gain windows are of particular benefit. In warm climates, it is especially desirable to have low solar heat gain windows. For example, solar heat gain coefficients of about 0.4 and below are generally recommended for buildings in the southern United States. Further, windows that are exposed to a lot of undesirable sun benefit from having a low solar heat gain coefficient. For example, windows on the east or west side of a building tend to get a lot of sun in the morning and afternoon. For applications like these, the solar heat gain coefficient of a window can play a vital role in maintaining a comfortable environment within the building. Thus, it is beneficial to provide windows of this nature with coatings that establish a low solar heat gain coefficient (i.e., high shading ability coatings).

Tradeoffs are sometimes made in low-emissivity coatings in order to obtain the desired shading properties. For example, the films selected to achieve a low SHGC may have the effect of restricting the visible reflectance to a higher level than is ideal. As a consequence, windows bearing these coatings may have a somewhat mirror-like appearance. It would be desirable to provide a high shading ability coating that has sufficiently low visible reflectance to obviate this mirror-like appearance problem.

In addition to having undesirably high visible reflectance, the reflected or transmitted colors of conventional high shading ability coatings may be less than ideal. For example, these coatings may exhibit hues that are more red or yellow than is desired. To the extent a coating has a colored appearance, it is pleasing if the coating exhibits a transmitted and reflected hue that is blue or blue-green. The chroma of these coatings may also to be greater than is desired. In most cases, it is preferable to provide a coating that is as color neutral (i.e., colorless) as possible. Thus, the reflected or transmitted colors of conventional low solar heat gain coatings may be less than ideal, both in terms of hue and chroma.

Some high shading ability low-emissivity coatings that provide advantageous properties have been commercially available for years. While some of these coatings have been more than acceptable, it would be desirable that they have even better mechanical durability, chemical durability, or both.

It would be desirable to provide controlled transmission coatings based on a blocker layer material that can provide exceptional mechanical durability. It would be particularly desirable to provide such a controlled transmission coating based on a blocker layer material that also provides exceptional moisture resistance. Further, it would be desirable to provide controlled transmission coatings that also exhibit pleasing color in reflection, transmission, or both.

SUMMARY

Figure 1:
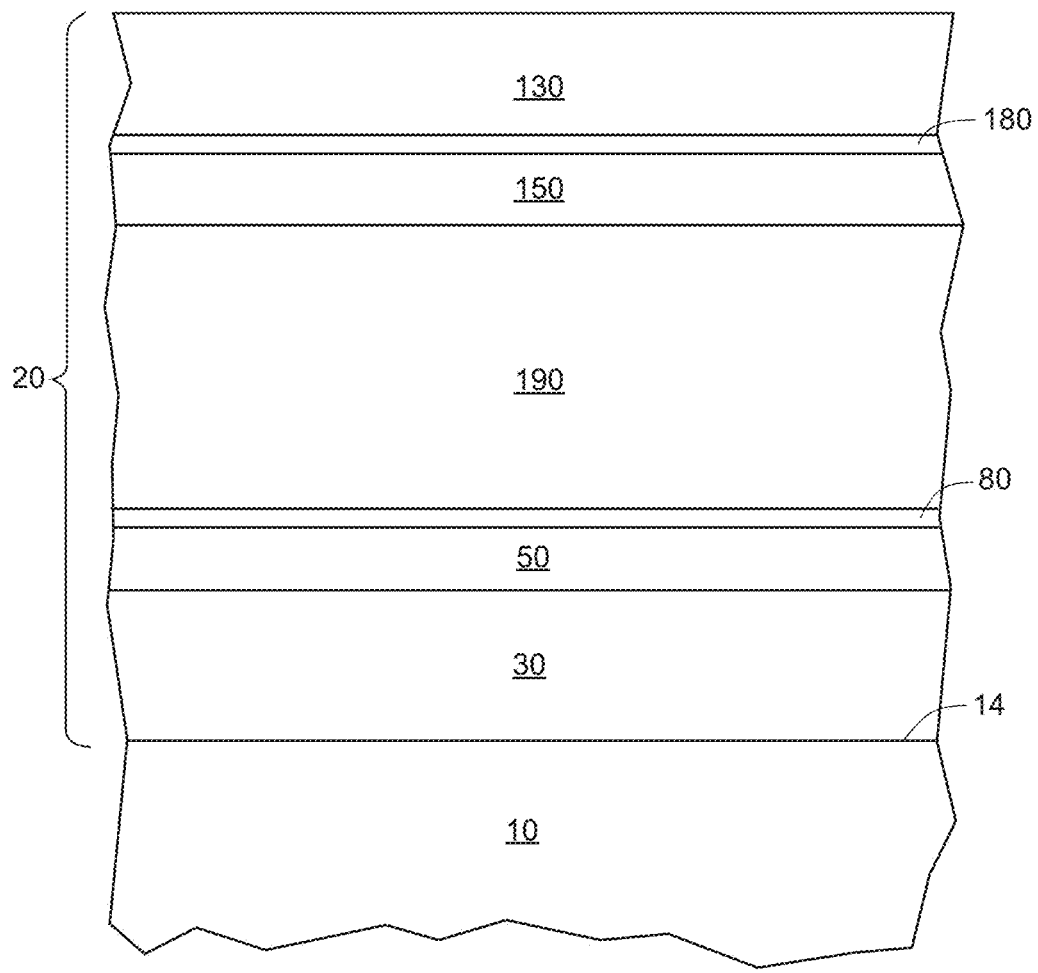
FIG. 1 is a schematic cross-sectional, broken-away view of a substrate having a surface coated with a controlled transmission coating in accordance with certain embodiments of the present invention.

In some embodiments, the invention provides a multiple-pane insulating glazing unit having a between-pane space. The multiple-pane insulating glazing unit includes a pane having a surface coated with a low-emissivity coating. This pane surface is exposed to the noted between-pane space. The low-emissivity coating comprises, in sequence moving outwardly from the noted pane surface, a dielectric base coat comprising oxide film, nitride film, or oxynitride film, a first infrared-reflective layer, a first nickel-aluminum blocker layer in contact with the first infrared-reflective layer, a dielectric middle coat comprising an oxide film in contact with the first nickel-aluminum blocker layer, a second infrared-reflective layer, a second nickel-aluminum blocker layer in contact with the second infrared-reflective layer, and a dielectric top coat comprising an oxide film in contact with the second nickel-aluminum blocker layer. Preferably, the first and second infrared-reflective layers each comprise silver, the low-emissivity coating has only two silver-containing infrared-reflective layers, and the multiple-pane insulating glazing unit has a visible transmittance of between 0.3 and 0.5.

Certain embodiments provide a multiple-pane insulating glazing unit having a between-pane space. The multiple-pane insulating glazing unit includes a pane having a surface coated with a low-emissivity coating. This pane surface is exposed to the noted between-pane space. In the present embodiments, the low-emissivity coating comprises, in sequence moving outwardly from the noted pane surface, a dielectric base coat comprising oxide film, nitride film, or oxynitride film, a first infrared-reflective layer, a first nickel-aluminum blocker layer in contact with the first infrared-reflective layer, a dielectric middle coat comprising an oxide film in contact with the first nickel-aluminum blocker layer, a second infrared-reflective layer, a second nickel-aluminum blocker layer in contact with the second infrared-reflective layer, and a dielectric top coat comprising an oxide film in contact with the second nickel-aluminum blocker layer. Preferably, the first and second infrared-reflective layers each comprise silver. In the present embodiments, the first and second nickel-aluminum blocker layers have a combined thickness of from 90 angstroms to 165 angstroms, the low-emissivity coating has only two silver-containing infrared-reflective layers, and the multiple-pane insulating glazing unit has a visible transmittance of between 0.3 and 0.5. In addition, the present embodiments preferably are characterized by the following features (i) and (ii).

(i) The first nickel-aluminum blocker layer has an outer interface and an inner interface. The outer interface adheres to the oxide film of the dielectric middle coat, while the inner interface of the first nickel-aluminum blocker layer adheres to the metallic silver film of the first infrared-reflective layer. The outer interface of the first nickel-aluminum blocker layer comprises aluminum oxide; the inner interface of the first nickel-aluminum blocker layer comprises metallic nickel.

(ii) The second nickel-aluminum blocker layer has an outer interface and an inner interface. The outer interface adheres to the oxide film of the dielectric top coat, while the inner interface of the second nickel-aluminum blocker layer adheres to the metallic silver film of the second infrared-reflective layer. The outer interface of the second nickel-aluminum blocker layer comprises aluminum oxide; the inner interface of the second nickel-aluminum blocker layer comprises metallic nickel.

Some embodiments of the invention provide a laminated glass assembly comprising first and second glass panes, a polymer interlayer, and a controlled transmission coating. The polymer interlayer is sandwiched between the first and second glass panes. The controlled transmission coating is on an internal surface of the first pane, such that the controlled transmission coating is located between the first pane and the polymer interlayer. The controlled transmission coating comprises, in sequence moving away from the internal surface of the first pane, a dielectric base coat comprising oxide film, nitride film, or oxynitride film, a first infrared-reflective layer, a first nickel-aluminum blocker layer in contact with the first infrared-reflective layer, a dielectric middle coat comprising an oxide film in contact with the first nickel-aluminum blocker layer, a second infrared-reflective layer, a second nickel-aluminum blocker layer in contact with the second infrared-reflective layer, and a dielectric top coat comprising an oxide film in contact with the second nickel-aluminum blocker layer. Preferably, the first and second infrared-reflective layers each comprise silver, and the controlled transmission coating has only two silver-containing infrared-reflective layers.

DETAILED DESCRIPTION

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

The present invention provides controlled transmission coatings that include at least one nickel-aluminum layer. The nickel-aluminum layer has utility in a wide variety of controlled transmission coatings. Particular utility is provided for silver-based low transmission coatings (i.e., coatings that have a visible transmission of less than 50% and include at least one silver-containing infrared-reflective film). In some embodiments, the controlled transmission coating is a heat-treatable (or heat treated, e.g., tempered) low-emissivity coating.

The invention provides a controlled transmission coating on a substrate (e.g., a glazing sheet). Substrates suitable for use in connection with the present invention include the substrate class comprising flat, sheet-like substrates. A substrate of this nature has two opposed major surfaces (or "faces"). In most cases, the substrate will be a sheet of transparent material (i.e., a transparent sheet). The substrate may be a sheet of glass. One type of glass that is commonly used in manufacturing glass articles (e.g., insulating glass units) is soda-lime glass. Soda-lime glass will be a preferred substrate in many cases. Of course, other types of glass can be used as well, including those generally referred to as alkali-lime-silicon dioxide glass, phosphate glass, and fused silicon dioxide. If desired, tinted glass can be used. In some cases, the substrate will comprise a polymeric (e.g., plastic) material that is transparent or translucent.

Substrates of various sizes can be used in the present invention. Commonly, large-area substrates are used. Certain embodiments involve a substrate having a length and/or width of at least 0.5 meter, preferably at least 1 meter, perhaps more preferably at least 1.5 meters (e.g., between 2 meters and 4 meters), and in some cases at least 3 meters. In some embodiments, the substrate is a jumbo glass sheet having a length and/or width that is between 3 meters and 10 meters, e.g., a glass sheet having a width of about 3.5 meters and a length of about 6.5 meters.

Substrates of various thicknesses can be used in the present invention. For example, the substrate (which can optionally be a glass sheet) can have a thickness in the range of from 1-14 mm, such as from 2-14 mm. Some embodiments involve a substrate with a thickness of between 2 mm and 5 mm, such as between 2.3 mm and 4.8 mm, and perhaps more preferably between 2.5 mm and 4.8 mm. In one example, a sheet of glass (e.g., soda-lime glass) with a thickness of about 3 mm is used.

FIG. 1 shows one embodiment of the invention involving a "double-IR-layer-type" controlled transmission coating, i.e., a low-emissivity coating or other controlled transmission coating based on two infrared-reflective layers. Low-emissivity coatings are well known in the present art. Therefore, given the present teaching as a guide, those skilled in this art would be able to readily select and vary the precise nature (e.g., composition, thickness, and deposition process) of the various films in the present coating to accommodate different applications. Thus, the film stacks described herein are merely exemplary.

In the embodiment of FIG. 1, the controlled transmission coating 20 has two infrared-reflective layers 50, 150. These layers 50, 150 can be formed of any desired infrared-reflective material. Silver is the most commonly used infrared-reflective material. However, gold, copper, or another infrared-reflective material can be used. Likewise, alloys or mixtures of these materials can be used. In many cases, it will be preferable to form these layers 50, 150 of silver or silver-containing film. For example, one or each of these layers 50, 150 can optionally be formed of silver combined with a small amount (e.g., about 5% or less) of gold, platinum, or tin. Those skilled in the present art may prefer to use other known types of silver-containing films. Moreover, if desired, one or both of these layers 50, 150 may comprise a transparent conductive oxide film (e.g., ITO) or an electrically conductive nitride film (e.g., TiN).

The first infrared-reflective layer 50 preferably has a thickness of between 50 and 175 angstroms. A lesser or greater thickness, however, may be suitable for certain applications. Typically, it is advantageous to select the thicknesses and materials of the infrared-reflective films 50, 150 so as to provide infrared reflectance values of above 60%, and more preferably above 85% (in the 3 to 10 micron range). In some cases, the coating is designed to achieve infrared reflectance values as close as possible to 100%, while still providing the desired level of visible transmission. In certain embodiments, the first infrared-reflective layer 50 comprises silver at a thickness of from 70 to 150 angstroms. As one example, silver at a thickness of about 85 angstroms can be used.

Oxygen is preferably prevented from coming into reactive contact with the infrared-reflective film 50. Thin silver film, for example, is known to be highly sensitive to all forms of energy, and since it is not wetting dielectric surfaces, it may disintegrate and form islands. Exposure to impact by energetic ions (e.g., of oxygen), which can originate from the sputtering process in applying an immediately overlying antireflection film, can damage the fresh silver film. To prevent this, a thin metal film (sometimes referred to as a "sacrificial layer" or "blocker layer") is coated on top of the silver film with low power. This forms a stronger bond to the silver film and keeps the silver material from de-wetting and clustering. To bond this thin metal film strongly to the immediately overlying dielectric layer, part of the metal blocker layer preferably is reacted (e.g., oxidized) to form a strong bond with the immediately overlying dielectric layer. Preferably, there is no well-defined, sharp (e.g., "discrete") interface between the metallic and reacted portions of the blocker layer. In the past, some blocker layers were made sputtering by sputtering titanium metal on top of a silver layer, and the titanium was partially reacted (e.g., oxidized) by residual gases or so called crosstalk from adjacent reactive sputtering stations that are not perfectly controlled. As the power and sputtering speed were low (for depositing the thin blocker layer), the degree of reaction (e.g., oxidation) and the thickness of the reacted portion was not well controlled. The thickness of the remaining metallic part will impact both the coating's absorption of light and the mechanical cohesion at the interface, as well as influencing mechanical and chemical properties of the final product.

The present nickel-aluminum blocker film is particularly well suited for simultaneously: i) preventing oxygen from reaching and reacting with an underlying metallic infrared-reflective film, ii) adhering strongly to both the underlying metallic infrared-reflective film (in some embodiments, due to a non-reacted nickel component) and an overlying oxide film (e.g., due to its more easily reacted aluminum component), iii) providing the coating with particularly good mechanical durability, iv) providing the coating with exceptional moisture resistance, and v) enabling good control over optical properties (e.g., visible transmission) of the coating. It has been discovered that with the present Ni/Al blocker films, after completing the sputtering process and any subsequent heat-treatment in air, the targeted amount of remaining nickel metal is largely independent from the minute, difficult to control changes in coater vacuum conditions.

Aluminum reacts readily with oxygen, particularly at elevated temperatures, to form aluminum oxide (i.e., "alumina"). Nickel tends to be less reactive with oxygen. It is therefore postulated that when a nickel-aluminum film is deposited directly over (i.e., so as to be in contact with) an underlying silver layer and directly under (i.e., so as to be in contact with) an overlying oxide layer, aluminum in an upper portion of the blocker film becomes oxidized or more oxidized (perhaps fully oxidized), while nickel in a lower portion of the layer remains metallic or in substoichiometric form. Preferably, nickel at the interface with the underlying silver film remains metallic, as does the silver film itself. This appears to provide an exceptional bond with both the underlying metallic film and the overlying oxide film. While the foregoing mechanism is believed to contribute to the exceptional properties achieved by the present coatings, this explanation is not intended to be binding.

The nickel-aluminum blocker film is capable of chemically reacting with, and thus capturing, oxygen to form oxides of the nickel-aluminum. The nickel-aluminum film may also suppress the mobility of silver atoms during any heat-treatment. In such cases, the nickel-aluminum layer may help maintain a continuous silver film.

It is surmised that when a film stack including oxide and/or nitride films is heated to glass tempering temperatures, the excess oxygen and/or nitrogen in these films may become mobile, and at such high temperatures are very reactive. It is thought that such highly reactive oxygen and/or nitrogen can be captured by the nickel-aluminum blocker film(s). As described in U.S. Pat. No. 6,919,133, conventional glass tempering is commonly performed in an oxidizing atmosphere (e.g., air). The teachings of this '133 patent are hereby incorporated herein insofar as they describe (see Example 1) a conventional glass tempering process, wherein glass is treated at elevated temperatures reaching about 734 C. It is also surmised that reactive oxygen from the atmosphere may penetrate the film stack during tempering. In such cases, this reactive oxygen may be captured by the nickel-aluminum blocker film(s) as well.

In the embodiment of FIG. 1, a first nickel-aluminum blocker film 80 is formed upon the first infrared-reflective film 50. In some cases, the nickel-aluminum film is deposited as a metallic (i.e., elemental metal) film. Such film can be sputtered, for example, from one or more metallic (e.g., alloy) targets onto the infrared-reflective film 50 in an inert atmosphere (e.g., argon). If desired, one or more nickel-aluminum targets can be sputtered. Alternatively, a metallic aluminum target can be co-sputtered with a nickel alloy target. The thus coated substrate may then be conveyed into a subsequent oxygen-containing sputtering zone (e.g., where a subsequent oxide film is deposited upon the nickel-aluminum film). As a result of this exposure, the nickel-aluminum film will typically become at least partially oxidized. Preferably, an outer portion of this layer (or at least aluminum therein) will become oxidized, while an inner portion (or at least nickel therein) remains metallic. Providing metallic nickel in the inner portion can impart additional absorption of visible radiation, thus facilitating particularly good control over visible transmission. This is advantageous for providing the coating with a low level of visible transmission. The discussion in this paragraph applies for each nickel-aluminum blocker film in the coating.

In certain embodiments, the nickel-aluminum film is deposited as a sub-oxide (i.e., substoichiometric) film. If desired, the nickel-aluminum film, as deposited, can be substoichiometric across the entire thickness of the film. In some cases, a sub-oxide nickel-aluminum film is deposited by sputtering one or more sub-oxide nickel-aluminum targets onto the first infrared-reflective film 50 in an inert atmosphere (e.g., argon). If desired, some oxygen, nitrogen, or both can be used in the sputtering atmosphere, but in an amount small enough to deposit the film as a sub-oxide. When provided, the sub-oxide nickel-aluminum target(s) can optionally further include titanium sub-oxide, e.g., $TiO_x$, where x is less than 2. In other cases, a sub-oxide nickel-aluminum film is deposited by sputtering one or more metallic nickel-aluminum targets onto the first infrared-reflective film 50 in an oxidizing atmosphere wherein the amount and/or reactivity of oxygen is controlled to deposit the film as a sub-oxide. In still other cases, separate targets formed respectively of nickel alloy and metallic aluminum are co-sputtered in a sub-oxidizing atmosphere (wherein the amount and/or reactivity of oxygen are controlled to deposit the film as a sub-oxide). If desired, one or each of the co-sputtered targets may include titanium. Regardless of which deposition method is used, the thus coated substrate may then be conveyed into a subsequent oxygen-containing sputtering zone (e.g., where a subsequent oxide film is deposited upon the sub-oxide nickel-aluminum film). As a result of this exposure, the sub-oxide film will become further oxidized. Preferably, an outer portion of this layer (or at least aluminum therein) will become more oxidized (optionally fully oxidized), while an inner portion (or at least nickel therein) remains less oxidized (e.g., sub stoichiometric). It has been discovered that the specific combination of nickel and aluminum in sub-oxide form can provide particularly good durability. This can be especially advantageous for laminated glass embodiments (e.g., where both the controlled transmission coating and a polymer interlayer are sandwiched between two glass panes, such that there is no air space between the two panes). The discussion in this paragraph applies for each nickel-aluminum blocker film in the coating.

It is to be understood that the term "nickel-aluminum" is used herein to refer to any compound that includes at least some nickel and at least some aluminum. Included in this definition is any alloy or mixture comprising both nickel and aluminum, whether metallic (i.e., elemental metal) or in the form of an oxide, a nitride, an oxynitride, etc., and optionally including one or more other desired materials. In some embodiments, nickel and aluminum are the only metals dispersed along the entire thickness of the nickel-aluminum blocker film. For example, the nickel-aluminum film can optionally be free of (i.e., devoid of) metals other than nickel and aluminum. If desired, the nickel-aluminum can consist essentially of (or consist of) metallic nickel and metal aluminum, optionally together with reaction products (e.g., oxides, nitrides, oxynitrides, etc.) thereof. In some cases, the nickel-aluminum consists essentially of (or consists of) nickel, aluminum, and oxygen and/or nitrogen. The discussion in this paragraph applies for each nickel-aluminum blocker film in the coating.

Preferably, the nickel-aluminum blocker film contains (and/or is deposited as film containing) more than 7.5% aluminum by weight. Additionally or alternatively, the film can optionally contain (and/or be deposited as film containing) less than 30% aluminum by weight. Thus, the blocker film can advantageously contain (and/or be deposited as film containing) aluminum at a weight percentage of between 7.5% and 30%, such as between 7.5% and 25%, or between 7.5% and 15%, e.g., about 10%, with the remainder optionally being nickel. In one embodiment, the nickel-aluminum film is deposited as film containing about 90% nickel and about 10% aluminum. In embodiments where the nickel-aluminum film comprises oxygen, nitrogen, or both, the foregoing percentages are on a metal-only basis. The discussion in this paragraph applies for each nickel-aluminum blocker film in the coating.

In certain embodiments, the nickel-aluminum film also includes titanium. In such cases, the relative amounts of nickel, aluminum, and titanium can be varied depending upon the particular application, the properties desired, etc. When provided, titanium can be present in the nickel-aluminum film in metallic form, stoichiometric oxide form, and/or sub-oxide form. The discussion in this paragraph applies for each nickel-aluminum blocker film in the coating.

In certain embodiments, the first blocker film 80 is a single layer blocker coating. In some cases, it is deposited in metallic form, in which case it may optionally consist essentially of (or consist of) nickel and aluminum, or it may consist essentially of (or consist of) nickel, aluminum and titanium. In such cases, the first nickel-aluminum blocker film 80 preferably is sandwiched directly between (i.e., so as to contact both) an underlying infrared-reflective film (e.g., a silver layer) and an overlying oxide film. In other embodiments, the first nickel-aluminum blocker film 80 is deposited directly over the first infrared-reflective layer 50, a titanium-containing film is deposited directly over the first nickel-aluminum blocker film, and a transparent dielectric film (e.g., an oxide film) is deposited directly over the titanium-containing film. This can optionally be the case for any one or more (e.g., all) blocker films in the coating. The titanium-containing film can be a titanium sub-oxide film, titanium dioxide, or an outer portion of the film can comprise $TiO_2$ while an inner portion comprises titanium sub-oxide, metallic titanium, or both. The titanium-containing film can optionally also contain nickel and aluminum.

In still other embodiments, a titanium-containing film is deposited directly over the first infrared-reflective layer 50, a first nickel-aluminum blocker film 80 is deposited directly over the titanium-containing film, and a transparent dielectric (e.g., an oxide film) is deposited directly over the first nickel-aluminum blocker film. Here again, this can optionally be the case for any one or more (e.g., all) blocker films in the coating. The titanium-containing film can be a titanium sub-oxide film or a titanium dioxide film, or an outer portion of the film can be $TiO_2$ while an inner portion is titanium sub-oxide. The titanium-containing film can optionally also contain nickel and aluminum.

The first nickel-aluminum blocker film 80 has a thickness designed to protect the underlying first infrared-reflective film 50 and to control the optical properties (e.g., visible transmission) desired for the coated substrate. Generally, the thickness of the first nickel-aluminum blocker film 80 is between 15 angstroms and 90 angstroms.

In certain embodiments, the thickness of the first nickel-aluminum blocker film 80 is selected such that following a desired heat treatment (e.g., tempering) and the associated conversion of some of the aluminum, and possibly some of the nickel, to an oxide, there remains a portion (e.g., the innermost portion) of the nickel-aluminum layer that is not significantly oxidized. This inner portion may be metallic, or at least essentially non-oxidized. The blocker layer thickness, for example, can be selected such that the innermost portion remains metallic. In such cases, the unreacted portion will typically be (or include) that portion of the nickel-aluminum layer that is contiguous to a directly underlying infrared-reflective film. The discussion in this paragraph applies for each nickel-aluminum blocker film in the coating.

In the embodiment of FIG. 1, the first nickel-aluminum blocker film 80 is positioned over the outer face (i.e., the face oriented away from the substrate) of the first infrared-reflective film 50. Preferably, this nickel-aluminum blocker film 80 is positioned directly over (i.e., is in contact with) the underlying first infrared-reflective film 50.

With continued reference to the embodiment of FIG. 1, an antireflective base coat 30 is formed upon one of the two major surfaces of the substrate 10. The base coat 30 includes one or more transparent dielectric films. It is to be understood that the term "transparent dielectric" is used herein to refer to any non-metallic (e.g., neither a pure metal nor a metal alloy) compound film that includes any one or more metals and has a visible transmission of at least 50% when provided at a thickness of 300 angstroms or less. Included in this definition would be any film of metal oxide, metal nitride, metal oxynitride, metal carbide, metal sulfide, metal boride, or any combination thereof having visible transmission in the specified range. Further, the term "metal" should be understood to include all metals and semi-metals (i.e., metalloids). Preferably, each transparent dielectric film is an oxide, nitride, or oxynitride.

The antireflective base coat 30 preferably has an overall thickness of between 150 angstroms and 750 angstroms, and more preferably between 200 angstroms and 400 angstroms, such as from 300 to 400 angstroms. The base coat 30 may comprise one or more transparent dielectric materials. For example, a wide variety of metal oxides may be used, including oxides of zinc, tin, indium, bismuth, titanium, hafnium, zirconium, and alloys and mixtures thereof. While metal oxides are sometimes preferred due to their ease and low cost of application, metal nitrides (e.g., silicon nitride) and oxynitrides (e.g., silicon oxynitride) can also be used advantageously. Those skilled in the present art would be able to readily select other materials that could be used for the base coat 30.

The base coat 30 in the embodiment of FIG. 1 is depicted as being a single film. However, the base coat 30 can comprise a plurality of films, if so desired. For example, the base coat 30 can comprise two separate films, optionally formed of different transparent dielectric materials. In one example, the base coat 30 comprises a first film comprising silicon dioxide having a thickness of about 130 angstroms followed by a second film comprising zinc tin oxide having a thickness of about 230 angstroms.

The composition of the base coat 30 can be varied as desired. However, it is generally preferred that at least a thin film comprising zinc oxide be applied as the outermost portion (i.e., the portion farthest away from the substrate) of the base coat. This is believed to enhance the quality of the film stack, at least if the overlying infrared-reflective layer 50 is formed of silver. Zinc oxide-based films have been found to provide a good foundation for the nucleation of silver. Thus, it is preferable either to form the whole base coat 30 of film comprising zinc oxide or to form it with two or more films wherein the outermost film comprises zinc oxide.

As noted above, it is contemplated that the antireflective base coat 30 will comprise two or more films in certain embodiments. A variety of film stacks are known to be suitable for use as the antireflective base coat of a "double-IR-layer-type" low-emissivity coating. For example, the first film (i.e., the film nearest the substrate) may be tin oxide, titanium dioxide, silicon nitride, or an alloy or mixture of zinc oxide, such as an alloy or mixture of zinc oxide and bismuth oxide, tin oxide, or indium oxide. As noted above, the second film preferably comprises zinc oxide (such as pure zinc oxide, zinc tin oxide, or zinc aluminum oxide), at least if the overlying infrared-reflective film 50 is formed of silver. While the relative thicknesses of these two films can be varied as desired, the combined thickness of both films is preferably between 150 angstroms and 750 angstroms, such as from 300 angstroms to 400 angstroms. Those skilled in the art would be able to readily select a variety of other suitable film stacks to use as the antireflective base coat 30.

In the embodiment of FIG. 1, the second illustrated film 50 is the first infrared-reflective layer 50, and the third illustrated film 80 is the first nickel-aluminum blocker film. Both of these layers 50, 80 have already been discussed.

With continued reference to FIG. 1, an intermediate film region 190 is positioned outwardly from (i.e., further from the substrate than) the first infrared-reflective layer 50, e.g., on the first blocker film 80. In its simplest form, this intermediate film region 190 consists of a single layer of a transparent dielectric material. For example, a single transparent dielectric film (e.g., zinc tin oxide) having a thickness of about 400-1,200 angstroms can be used.

Alternatively, two or more separate transparent dielectric films can be positioned between the infrared-reflective layers 50, 150. In such cases, these films preferably have a combined thickness of about 400-1,200 angstroms.

Thus, in a controlled transmission coating having two infrared-reflective films 50, 150, the innermost infrared-reflective film 50 preferably is directly followed by, moving outwardly, a contiguous sequence of a nickel-aluminum blocker film 80 and a metal oxide film (e.g., zinc tin oxide). If desired, one or more additional films can be provided between the metal oxide film and the second infrared-reflective film 150.

FIG. 1 depicts a "double-IR-type" low-emissivity coating. Thus, a second infrared-reflective film 150 is provided. The materials useful in forming the first infrared-reflective film 50 are also useful in the forming second infrared-reflective film 150. In most cases, both infrared-reflective films 50, 150 will be formed of the same material, although this is not a requirement. Preferably, both films 50, 150 are silver or silver-containing films, with the second (and outermost) IR-reflective film 150 being thicker than the first (and innermost) IR-reflective film 50. One embodiment provides a first infrared-reflective layer 50 of silver at a thickness in the range of 70-95 angstroms, in combination with a second infrared-reflective layer 150 of silver at a thickness in the range of 100-125 angstroms.

A second nickel-aluminum film 180 can advantageously be provided over the second infrared-reflective film 150. This nickel-aluminum film 180 can be of the nature described above relative to the first blocker film 80. The second nickel-aluminum film 180 can optionally be formed directly upon the underlying infrared-reflective film 150. The thickness of this nickel-aluminum film 180 is preferably in the range of about 15-85 angstroms. Thus, in some embodiments, both blocker films 80, 180 are nickel-aluminum layers, each deposited at a thickness of about 15-85 angstroms. In other embodiments, the coating has only one nickel-aluminum blocker film. In such cases, the coating may include one or more other blocker films of a different composition.

In certain preferred embodiments, the coating 20 includes two blocker films 80, 180 having different thicknesses. For example, one of the nickel-aluminum blocker films can be at least 10% thicker than another of the nickel-aluminum blocker films. In some cases, two nickel-aluminum blocker films 80, 180 are deposited such that a first 80 of the two nickel-aluminum blocker films 80, 180 is located closer to the glazing sheet than is a second 180 of the two nickel-aluminum blocker films, and the first nickel-aluminum blocker film is more than 10% thicker than the second nickel-aluminum blocker film.

In one group of embodiments, the second IR-reflective film 150 is thicker than the first IR-reflective film 50, and in combination, the first nickel-aluminum blocker film 80 is thicker than the second nickel-aluminum blocker film 180. Exemplary film stacks of this nature are detailed below.

With continued reference to FIG. 1, a nickel-aluminum layer can be positioned directly beneath the second infrared-reflective layer 150, if so desired. Additionally or alternatively, a nickel-aluminum layer (not shown) can optionally be positioned directly beneath the first infrared-reflective layer 50.

In the embodiment of FIG. 1, an outer film region 130 is positioned outwardly from the second infrared-reflective film 150 (e.g., directly upon the second blocker film 180). The exact nature of the outer film region 130 can be varied as desired. In its simplest form, the outer film region 130 consists of a single transparent dielectric film. A wide variety of metal nitrides (e.g., silicon nitride), oxynitrides (e.g., silicon oxynitride), or metal oxides (e.g., oxides of zinc, tin, indium, bismuth, titanium, hafnium, zirconium, and alloys and mixtures thereof) can be used as the outermost layer of a low-emissivity coating. In one embodiment, the outer film region 130 is a single film (e.g., silicon nitride, tin oxide, or zinc tin oxide) having a thickness of between 100 angstroms and 500 angstroms, e.g., between 150 angstroms and 400 angstroms.

It may be preferable to use an outer film region 130 comprising a plurality of separate layers. For example, the outer film region 130 can comprise two separate layers. A first outer layer can be deposited directly upon the second blocker film 180. The first outer layer can be formed of any desired transparent dielectric material. For example, this layer can advantageously be formed of zinc tin oxide. The thickness of the first outer layer is preferably between 50 and 200 angstroms. A second outer layer can be deposited directly upon the first outer layer. While this layer can be formed of any desired transparent dielectric material, it is preferably formed of a chemically-durable material, such as silicon nitride. The thickness of the second outer layer is preferably between 25 and 300 angstroms, such as between 50 and 250 angstroms. In one example, the first outer layer is formed of zinc tin oxide at a thickness of about 75 angstroms, and the second outer layer is formed of silicon nitride at a thickness of about 205 angstroms. In another example, the first outer layer is formed of zinc tin oxide at a thickness of about 140 angstroms, and the second outer layer is formed of silicon nitride at a thickness of about 200 angstroms. More generally, a variety of film stacks are known to be suitable for use as the outer film region of a "double-IR-layer-type" low-emissivity coating.

Figure 2:
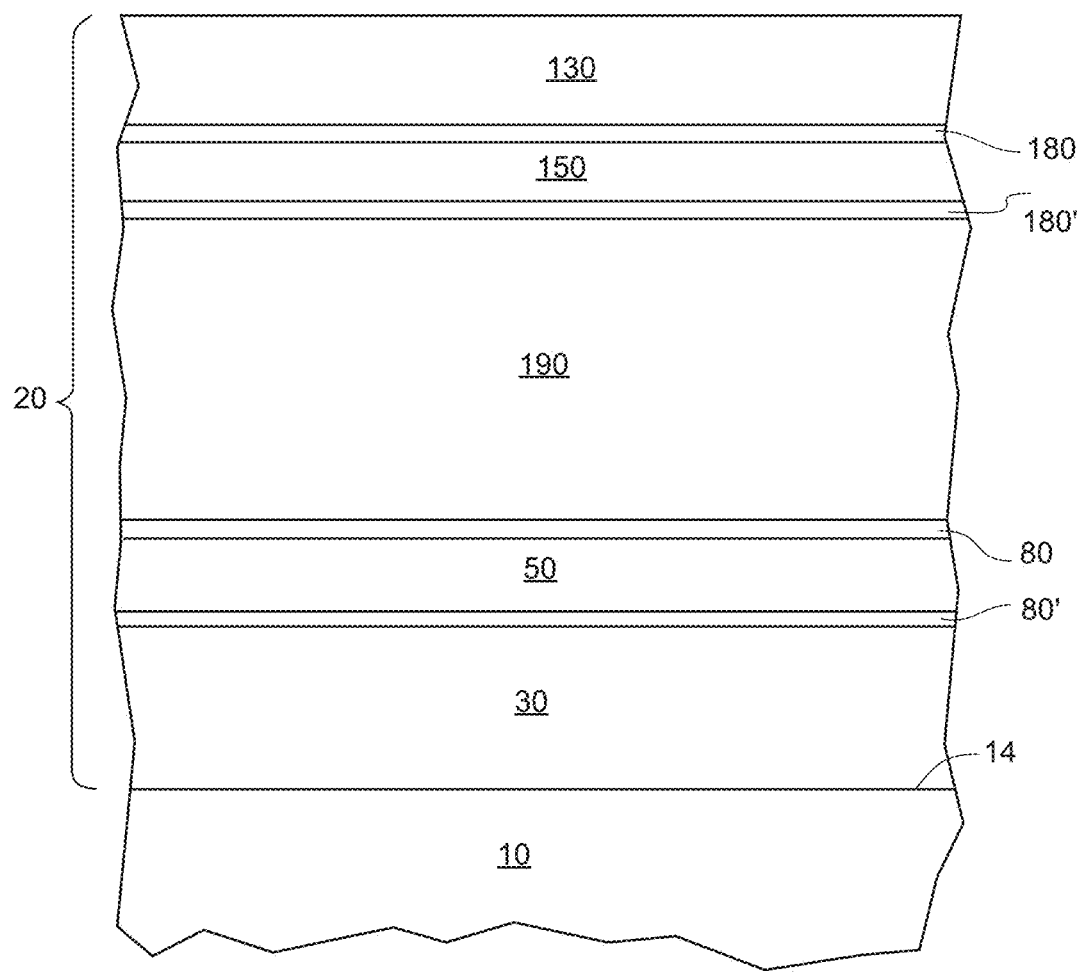
FIG. 2 is a schematic cross-sectional, broken-away view of a substrate having a surface coated with a controlled transmission coating in accordance with other embodiments of the invention.

FIG. 2 illustrates an embodiment wherein two nickel-aluminum films are positioned respectively under and over each infrared-reflective film in the coating. In this embodiment, the first infrared-reflective film 50 is sandwiched directly between (i.e., so as to contact) two nickel-aluminum films 80, 80', and the second infrared-reflective film 150 is sandwiched directly between two nickel-aluminum films 180, 180'. Sandwiching an infrared-reflective film (e.g., one formed of silver) directly between two nickel-aluminum layers may be advantageous, for example, in cases where it is desirable to provide particularly good protection for the infrared-reflective film, where particularly high shading ability is desired, or where it is desirable to provide particularly good mechanical durability, chemical durability, or both. When provided, the nickel-aluminum films 80', 180' beneath the infrared-reflective films 50, 150 can optionally be thinner than the nickel-aluminum films 80, 180 over the infrared-reflective films 50, 150. Additionally or alternatively, the nickel-aluminum films 80', 180' beneath the infrared-reflective films 50, 150 can optionally be oxidized to a greater extent than the nickel-aluminum layers 80, 180 over the infrared-reflective films 50, 150. For example, the nickel-aluminum film directly under an infrared-reflective layer may be oxidized (e.g., may comprise sub-oxide film) over its entire thickness, while the nickel-aluminum film directly over that infrared-reflective layer may have only an outer portion that is oxidized (the rest may be metallic). Thickness arrangements and/or relative oxidation states of this nature may be provided to establish high shading ability, without more reduction in visible transmission than is desired, while simultaneously providing particularly good mechanical durability, chemical durability, or both.

Thus, it will be appreciated that certain embodiments of the invention provide a controlled transmission coating having two infrared-reflective layers, and wherein there is at least one contiguous sequence of, moving outwardly, a zinc tin oxide film, a silver or silver-containing film, and a nickel-aluminum film. The silver or silver-containing film in this sequence is positioned directly over the zinc tin oxide film and directly beneath the nickel-aluminum layer. Further, an oxide film preferably is positioned directly over the nickel-aluminum layer in the noted contiguous sequence. It will be appreciated that the present coating 20 preferably has two such contiguous sequences.

One group of embodiments provides a substrate 10 bearing the controlled transmission coating 20. The substrate 10 has a first surface 12 and a second surface 14. The controlled transmission coating 20 is on the second surface 14. In some cases, the coated substrate 10 is a monolithic pane. Typically, the coated second surface 14 will be destined to be an internal surface facing a between-pane space 800 of a multiple-pane insulating glazing unit 110, while the first surface 12 is destined to be an external surface exposed to an outdoor environment.

Figure 3:
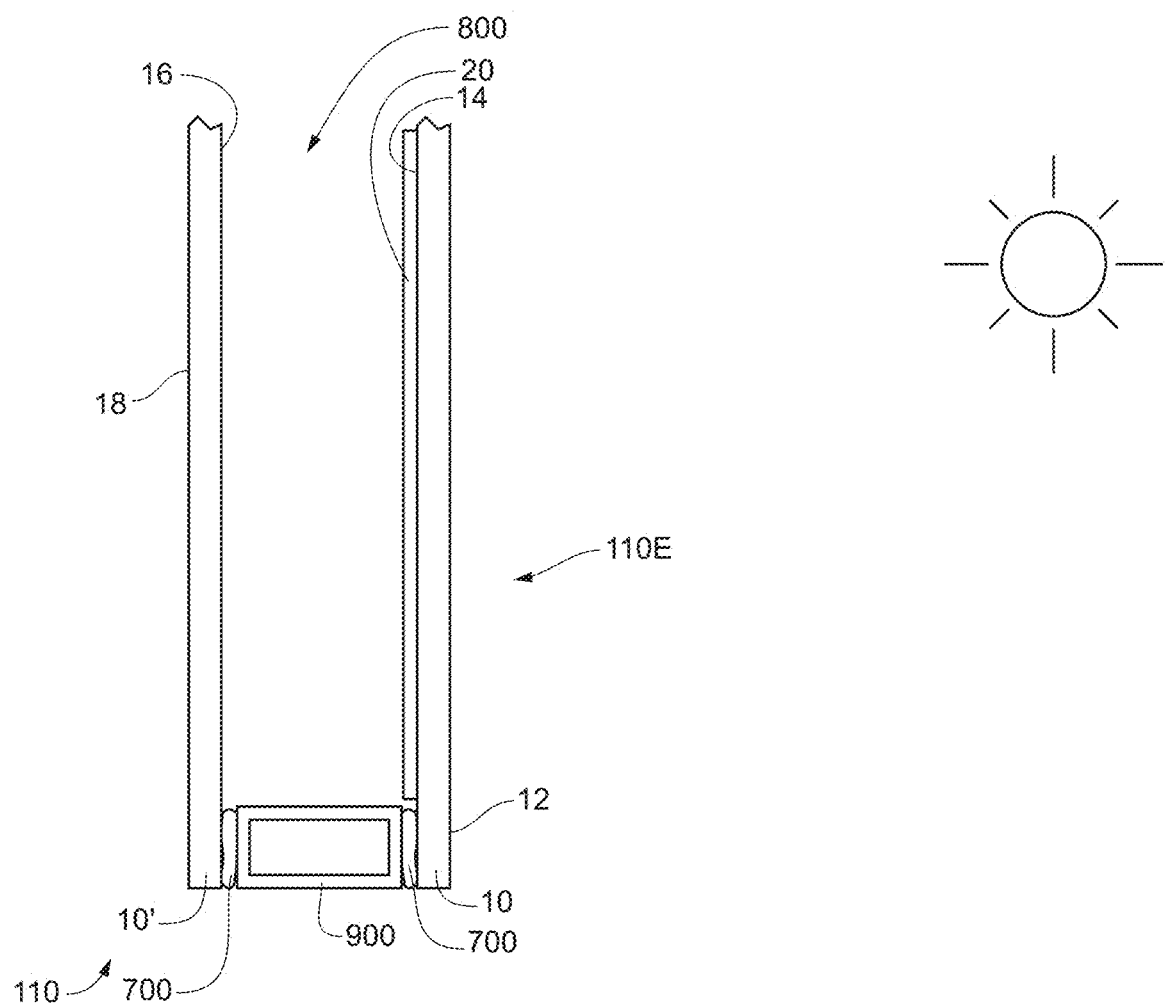
FIG. 3 is a schematic cross-sectional, broken-away view of a multiple-pane insulating glazing unit that includes a pane having a surface coated with a controlled transmission coating in accordance with certain embodiments of the invention.

Thus, certain embodiments provide a multiple-pane insulating glazing unit 110 having a substrate 10 coated with a controlled transmission coating 20. FIG. 3 is a partially broken-away schematic cross-sectional side view of a multiple-pane insulating glazing unit 110 in accordance with one such embodiment. In FIG. 3, the insulating glazing unit 110 has an exterior pane 10 and an interior pane 10' separated by a between-pane space 800. A spacer 900 (which can optionally be integral to a sash) is provided to separate the panes 10 and 10'. The spacer can be secured to the interior surfaces of each pane using one or more beads of adhesive 700. In some cases, an end sealant (not shown) is also provided. In the illustrated embodiment, the exterior pane 10 has an external surface 12 and an internal surface 14.

With respect to embodiments involving an IG unit, the "first" (or "#1") surface 12 will commonly be intended to be exposed to an outdoor environment. For example, when an IG unit is mounted on an exterior wall of a building, it is the #1 surface that radiation from the sun first strikes. The external surface of such an outboard pane is the so-called first surface. Moving from the #1 surface toward the interior of the building, the next surface is the "second" (or "#2") surface 14. Thus, the internal surface of the outboard pane is the so-called second surface. Moving further toward the interior of the building, the next surface is the "third" (or "#3") surface 16, followed by the "fourth" (or "#4") surface 18. This convention is carried forward for IG units having more than four major pane surfaces.

In the embodiment of FIG. 3, the second surface 14 of the first pane 10 bears the controlled transmission coating 20. The second pane 10' also has two opposed major surfaces 16, 18. The IG unit 110 can be mounted in a frame (e.g., a window frame) such that the first surface 12 of the first pane 10 is exposed to an outdoor environment. In some embodiments of this nature, surface 18 of the second pane 10' is exposed to a room-side environment (e.g., a temperature controlled environment) inside a home or other building. Internal surfaces 14 and 16 are both exposed to the between-pane space 800 of the illustrated insulating glazing unit. While surface 14 bears the controlled transmission coating 20 in FIG. 3, it is to be understood that surface 16 can alternatively or additionally bear such a coating.

Figure 4:
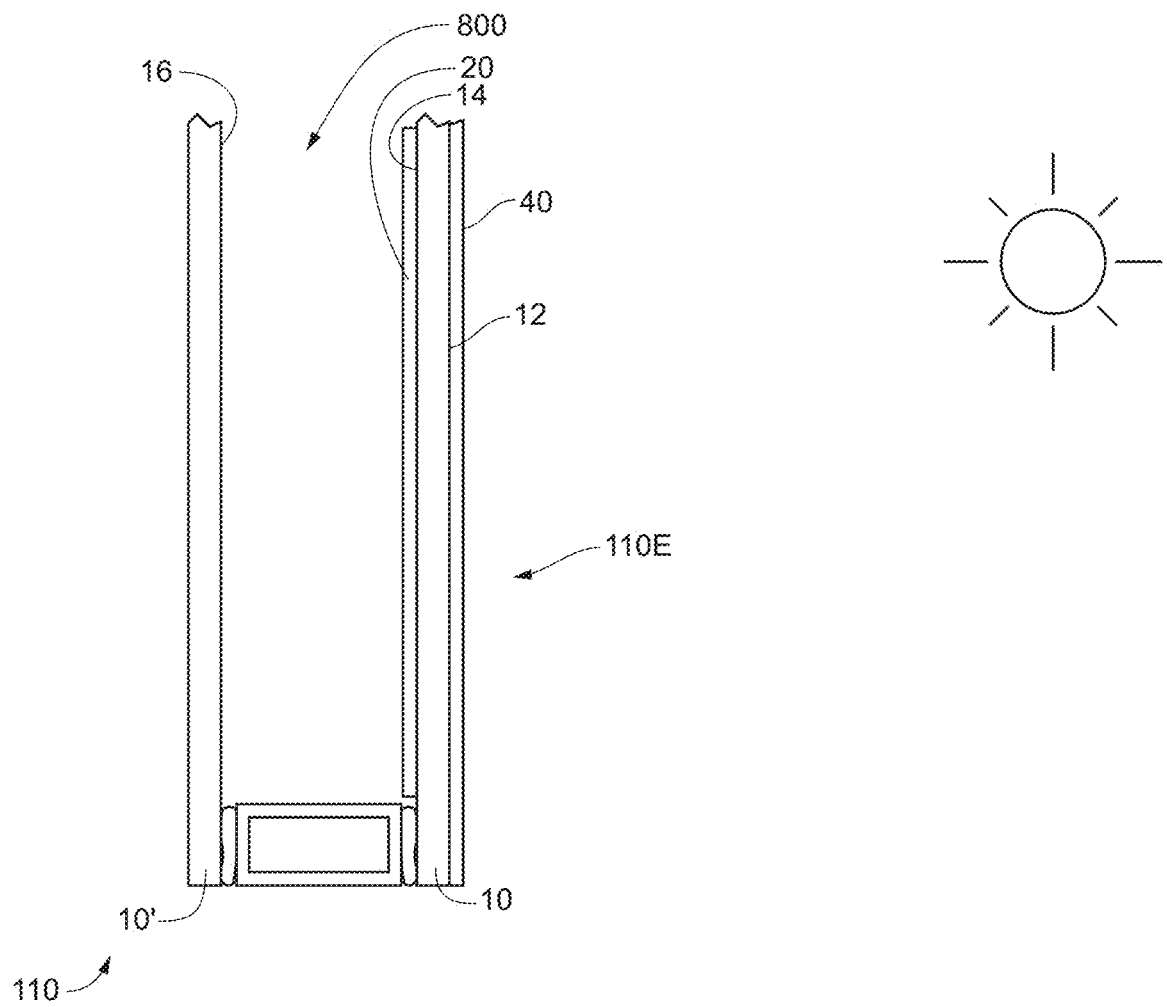
FIG. 4 is a schematic cross-sectional, broken-away view of a multiple-pane insulating glazing unit that includes a pane having an inner surface coated with a controlled transmission coating and an outer surface coated with a hydrophilic coating in accordance with certain embodiments of the invention.
Figure 6:
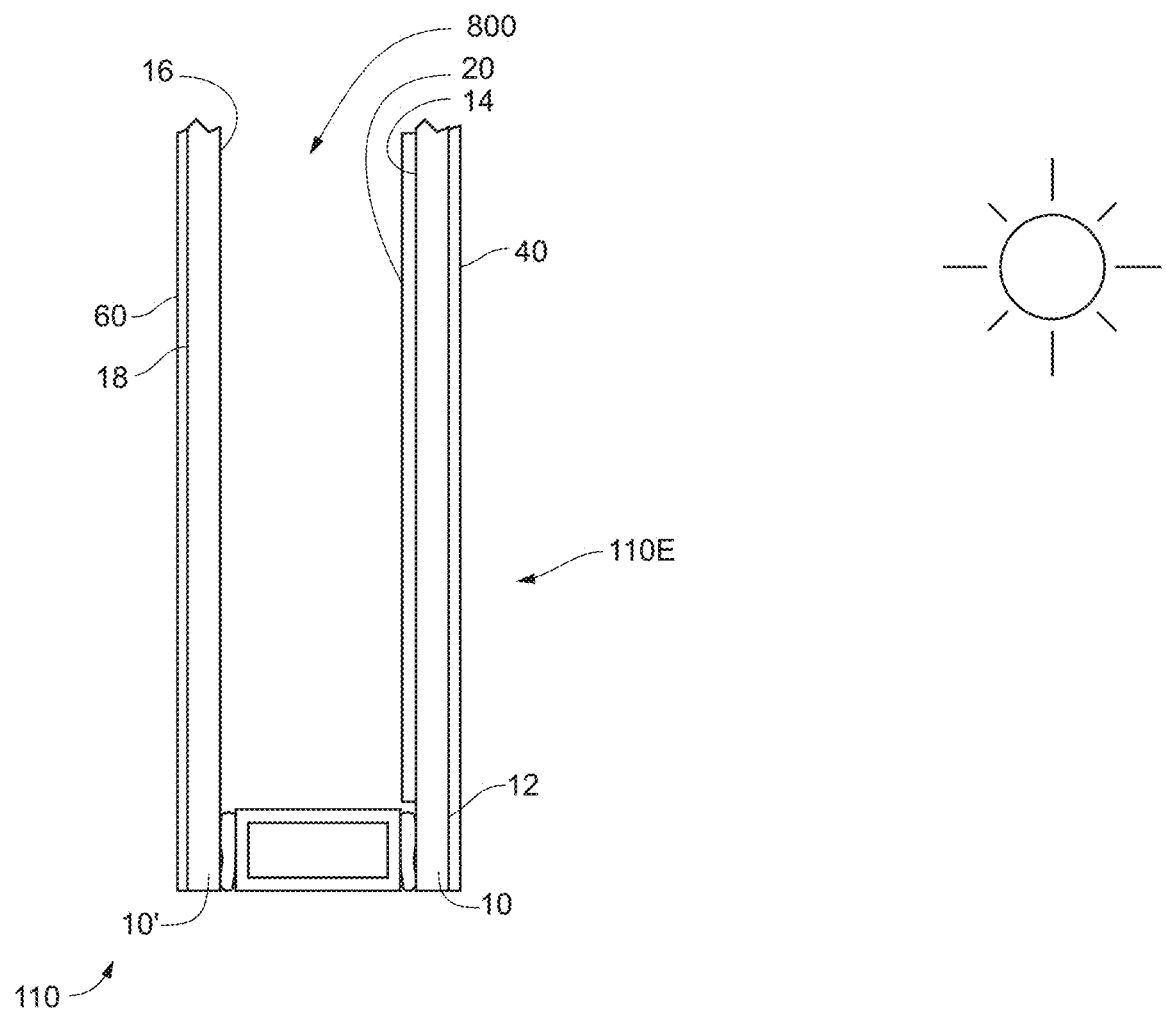
FIG. 6 is a schematic cross-sectional, broken-away view of a multiple-pane insulating glazing unit that includes a first pane having an inner surface coated with a controlled transmission coating and an outer surface coated with a hydrophilic coating, and a second pane having an outer surface coated with a transparent conductive coating in accordance with certain embodiments of the invention.

In some embodiments, a hydrophilic and/or photocatalytic coating 40 (hereinafter, a "hydrophilic" coating) can also be provided on the #1 surface of the IG unit 110. Reference is made to FIGS. 4 and 6. If desired, the hydrophilic coating can alternatively be provided on the other external surface (e.g., the #4 surface) of the IG unit 100. In some cases, the hydrophilic film 40 comprises titania and has a thickness of from 20 angstroms to 175 angstroms. In some embodiments, the #1 surface has a first hydrophilic coating 20, while the other external surface (e.g., the #4 surface) of the IG unit 100 has a second hydrophilic coating. Useful hydrophilic coatings are described in U.S. Pat. Nos. 7,294,404, 7,604,865, 7,713,632, 7,782,296, 7,862,309, 7,923,114 and 8,092,660, the salient teachings (i.e., the teachings concerning the hydrophilic coating) of each of which are hereby incorporated herein by reference.

When provided, the hydrophilic coating 40 can optionally further include a transparent conductive film. In such cases, the coating 40 can comprise a hydrophilic film, optionally comprising titania, over a transparent conductive film (optionally comprising both indium and tin). In some cases, the hydrophilic film comprising titania has a thickness of from 20 angstroms to 175 angstroms. In one example, the hydrophilic coating 40 has the following structure: glass/$SiO_2$ 100 Å/indium-tin metal 790 Å/$Si_3N_4$ 125 Å/silicon oxynitride 750 Å/$TiO_2$ 75 Å. In another example, the hydrophilic coating 40 (shown in FIGS. 4 and 6) has the following structure: glass/silica 35 Å/indium tin oxide 1200 Å/silicon nitride 95 Å/silicon oxynitride 805 Å/TiO$_2$ 60 Å.

Figure 5:
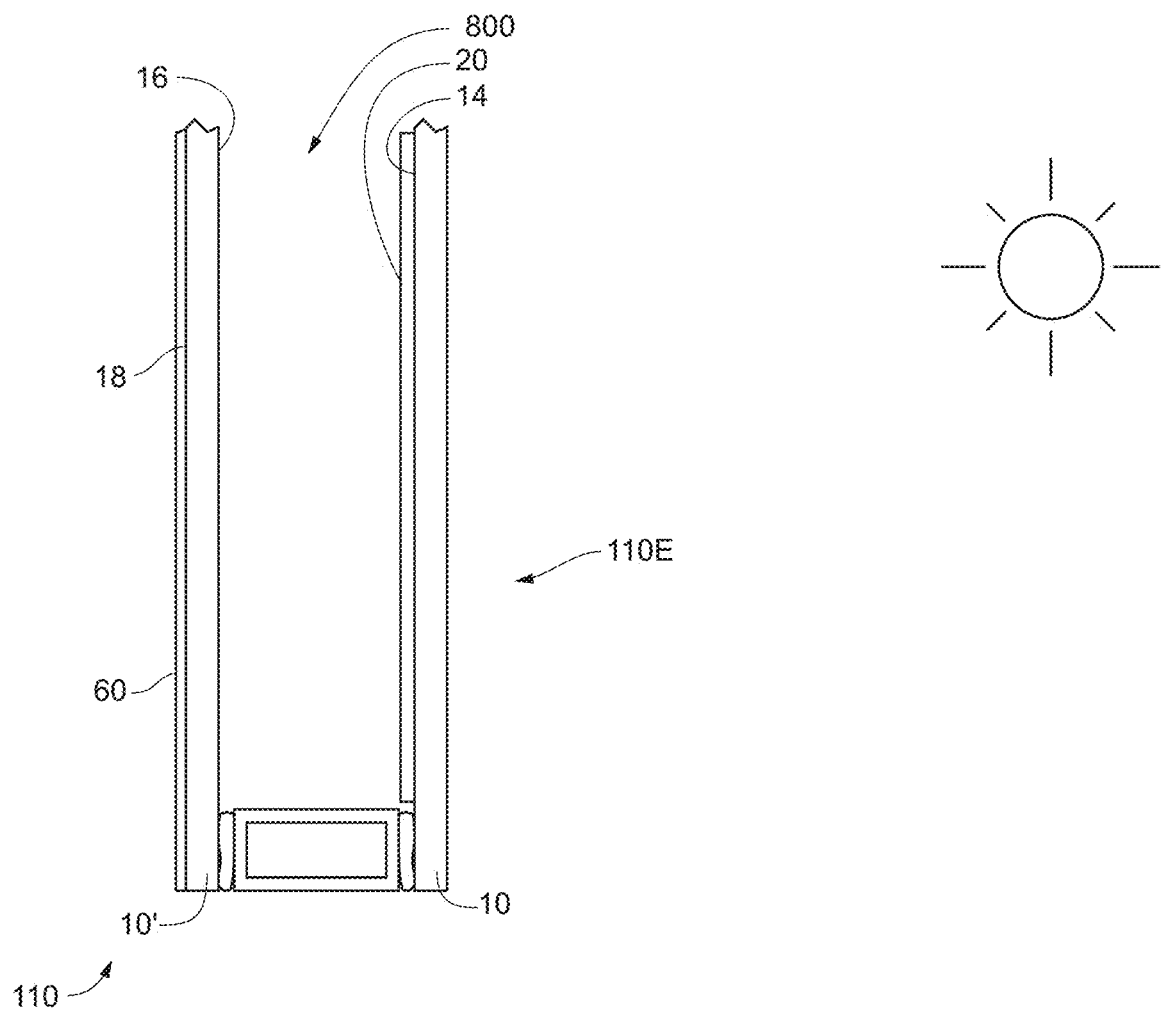
FIG. 5 is a schematic cross-sectional, broken-away view of a multiple-pane insulating glazing unit that includes a first pane having an inner surface coated with a controlled transmission coating and a second pane having an outer surface coated with a transparent conductive coating in accordance with certain embodiments of the invention.

As noted above, the multiple-pane insulating glazing unit 110 has two opposed, external pane surfaces. In the double glazing embodiments shown in FIGS. 3-6, these external surfaces are the #1 and #4 surfaces. The IG unit 110 can alternatively be a triple glazing, in which case the two external surfaces will be the #1 and #6 surfaces. In certain embodiments, at least one of the two external surfaces of the IG unit 110 is coated with a transparent conductive film 60. In the embodiment of FIG. 5, for example, the #4 surface of the IG unit 110 has a transparent conductive film 60. The transparent conductive film 60 can advantageously comprise both indium and tin. It can, for example, be an indium-tin oxide film. In other cases, it can be a metallic film of indium and tin. In one example, the transparent conductive film 60 is part of a coating having the following structure: glass/silica 300 Å/indium tin oxide 1350 Å/silicon nitride 125 Å/silicon oxynitride 600 Å. In another example, the transparent conductive film 60 is part of a coating having the following structure: glass/indium tin oxide 1325 Å/silicon nitride 440 Å.

In certain embodiments, the two opposed, external pane surfaces of the IG unit 110 are coated respectively with first 40 and second 60 transparent conductive coatings. Reference is made to FIG. 6. In some embodiments of this nature, the first transparent conductive coating 40 has a different thickness than the second transparent conductive coating. In addition, the first transparent conductive coating 40 may have a different thickness than the second transparent conductive coating 60. The first transparent conductive coating 40 can, for example, be or include a first transparent conductive film comprising both indium and tin, while the second transparent conductive coating 60 can be or include a second transparent conductive film comprising both indium and tin. In such cases, the first transparent conductive film can have a thickness of from 600 to 900 angstroms, while the second transparent conductive film has a thickness of from 900 to 1,500 angstroms. A hydrophilic film (e.g., TiO$_2$) can optionally be provided over the first transparent conductive film. Thus, coating 40 can be a transparent conductive coating, a hydrophilic coating, or both. When provided, the hydrophilic film can optionally have a thickness of from 20 to 175 angstroms. As just a few examples, the first 40 and second 60 transparent conductive coatings have the following structures:

first transparent conductive coating 40; glass/silica 35 Å/indium tin oxide 1200 Å/silicon nitride 95 Å/silicon oxynitride 805 Å/TiO$_2$ 60 Å, and second transparent conductive coating 60; glass/silica 300 Å/indium tin oxide 1350 Å/silicon nitride 125 Å/silicon oxynitride 600 Å, or first transparent conductive coating 40; glass/silica 35 Å/indium tin oxide 1200 Å/silicon nitride 95 Å/silicon oxynitride 805 Å/TiO$_2$ 60 Å, and second transparent conductive coating 60; glass/indium tin oxide 1325 Å/silicon nitride 440 Å, or first transparent conductive coating 40; glass/SiO$_2$ 100 Å/indium tin oxide 790 Å/Si$_3$N$_4$ 125 Å/silicon oxynitride 750 Å/TiO$_2$ 75 Å, and second transparent conductive coating 60; glass/indium tin oxide 1325 Å/silicon nitride 440 Å, or first transparent conductive coating 40; glass/SiO$_2$ 100 Å/indium tin oxide 790 Å/Si$_3$N$_4$ 125 Å/silicon oxynitride 750 Å/TiO$_2$ 75 Å, and second transparent conductive coating 60; glass/silica 300 Å/indium tin oxide 1350 Å/silicon nitride 125 Å/silicon oxynitride 600 Å.

The substrate 10 with the controlled transmission coating 20 has a number of beneficial properties. The ensuing discussion reports several of these properties. In some cases, properties are reported for a single (i.e., monolithic) pane 10 bearing the present coating 20 on one surface. In such cases, the reported properties are for a pane of clear 3 mm soda lime float glass. In other cases, properties are reported for an IG unit 110 having the present coating 20 on its #2 surface. In such cases, the reported properties are for an IG unit wherein both panes are clear 3 mm soda lime float glass with a ½ inch between-pane space filled with an insulative gas mix of 90% argon and 10% air. These specifics are, of course, by no means limiting to the invention. As just one example, the controlled transmission coating can alternatively be provided on the #3 surface of an IG unit. Absent an express statement to the contrary, the present discussion reports determinations made using the well-known WINDOW 7.1 computer program (e.g., calculating center of glass data) under NFRC100-2010 conditions.

The controlled transmission coating 20 provides good thermal insulating properties. For example, the sheet resistance of the present coating 20 is less than 5.0 Ω/square. Preferably, the sheet resistance of this coating 20 is less than 3.6 Ω/square. While the desired level of sheet resistance can be selected and varied to accommodate different applications, certain preferred coating embodiments (e.g., the exemplary film stacks disclosed herein) provide a sheet resistance of less than 3.0 Ω/square, such as from 2.0 to 2.9 Ω/square. In one example, the sheet resistance is about 2.70. The sheet resistance of the coating can be measured in standard fashion using a 4-point probe.

The coating 20 also has desirably low emissivity. For example, the emissivity of the coating 20 is less than 0.085. Preferably, the emissivity of this coating 20 is less than 0.07. While the desired level of emissivity can be selected and varied to accommodate different applications, certain preferred coating embodiments (e.g., the exemplary film stacks disclosed herein) provide an emissivity of less than 0.065, such as from 0.03 to 0.064. In one example, the emissivity is about 0.057. In contrast, an uncoated pane of clear glass would typically have an emissivity of about 0.84.

The term "emissivity" is well known in the present art. This term is used herein in accordance with its well-known meaning to refer to the ratio of radiation emitted by a surface to the radiation emitted by a blackbody at the same temperature. Emissivity is a characteristic of both absorption and reflectance. It is usually represented by the formula: E=1-Reflectance. The present emissivity values can be determined as specified in "Standard Test Method For Emittance Of Specular Surfaces Using Spectrometric Measurements," NFRC 301-2010, the entire teachings of which are incorporated herein by reference.

In addition to low sheet resistance and low emissivity, the present coating 20 provides good solar heat gain properties. As is well known, the solar heat gain coefficient (SHGC) of a window is the fraction of incident solar radiation that is admitted through a window. There are a number of applications where low solar heat gain windows are of particular benefit. In warm climates, for example, it is desirable to have low solar heat gain windows. For example, solar heat gain coefficients of about 0.4 and below are generally recommended for buildings in the southern United States. Further, windows that are exposed to a lot of undesirable sun benefit from having a low solar heat gain coefficient. Windows on the east or west side of a building, for instance, tend to get a lot of sun in the morning and afternoon. For applications like these, the solar heat gain coefficient plays a role in maintaining a comfortable environment within the building. Thus, it is beneficial to provide windows of this nature with coatings that establish a low solar heat gain coefficient (i.e., low solar heat gain coatings). Low solar heat gain coatings are, in fact, desirable for many window applications. However, some of these coatings have not offered a sufficient balance of desirable properties to be adopted more broadly.

A tradeoff is sometimes made in low solar heat gain coatings whereby the films selected to achieve a low SHGC have the effect of decreasing the visible transmittance to an even lower level than is desired and/or increasing the visible reflectance to a higher level than is ideal. As a consequence, windows bearing these coatings may have unacceptably low visible transmission, a somewhat mirror-like appearance, or both.

The present coating 1 provides a desirable low solar heat gain coefficient. For example, the solar heat gain coefficient of the present IG unit 110 is less than 0.4. Preferably, the present IG unit 110 has a solar heat gain coefficient of less than 0.27, such as from 0.18 to 0.26. While the desired SHGC level can be selected and varied to accommodate different applications, certain preferred embodiments (e.g., using the exemplary film stacks disclosed herein) provide an IG unit 110 having a solar heat gain coefficient of less than 0.26, such as from 0.18 to 0.25. In one example, the SHGC is about 0.236. Thus, the SHGC is less than 0.24 in some embodiments. The present coating 20 can provide a SHGC within any one or more of these ranges while at the same time providing exceptional color (as specified by the color ranges reported below) and a visible transmission controlled to remain in one or more of the transmission ranges reported below.

The term "solar heat gain coefficient" is used herein in accordance with its well-known meaning. Reference is made to NFRC 200-2014, the entire teachings of which are incorporated herein by reference. The SHGC can be calculated using the methodology embedded in the well-known WINDOW 7.1 computer program.

Further, the U Value of the present IG unit is low. As is well known, the U Value of an IG unit is a measure of the thermal insulating property of the unit. The smaller the U value, the better the insulating property of the unit. The U Value of the present IG unit is less than 0.4. Preferably, the present IG unit 110 has a U Value of less than 0.35. While the desired U value can be selected and varied to accommodate different applications, certain preferred embodiments (e.g., using the exemplary film stacks disclosed herein) provide an IG unit 110 having a U value of less than 0.3, such as from 0.16 to 0.29. In one example, the SHGC is about 0.256. Thus, the U value is less than 0.27 in certain embodiments. The present coating 20 can provide a U Value within any one or more of these ranges while at the same time providing exceptional color (as specified by the color ranges reported below) and a visible transmission controlled to remain in one or more of the transmission ranges reported below.

The term U Value is well known in the present art. It is used herein in accordance with its well-known meaning to express the amount of heat that passes through one unit of area in one unit of time for each unit of temperature difference between a hot side of the IG unit and a cold side of the IG unit. The U Value can be determined in accordance with the standard specified for $U_{winter}$ in NFRC 100-2014, the teachings of which are incorporated herein by reference.

In combination with the beneficial thermal insulating properties discussed above, the present coating 50 has desirable optical properties. As noted above, a tradeoff is sometimes made in low solar heat gain coatings whereby the films selected to achieve good thermal insulating properties have the effect of providing sub-optimal color properties. To the contrary, the present coating 50 provides a desirable combination of thermal insulation and optical properties.

The present IG unit 110 has a visible transmittance $T_{vis}$ in the range of from 0.3 to 0.5. While the desired level of visible transmittance can be selected and varied to accommodate different applications, certain preferred embodiments (e.g., the exemplary film stacks disclosed herein) provide an IG unit 110 having a visible transmittance in the range of from 0.35 to 0.45, such as about 0.40.

The term "visible transmittance" is well known in the art and is used herein in accordance with its well-known meaning to refer to the percentage of all incident visible radiation that is transmitted through the IG unit 110. Visible radiation constitutes the wavelength range of between about 380 nm and about 780 nm. Visible transmittance, as well as visible reflectance, can be determined in accordance with NFRC 300-2014, Standard Test Method for Determining the Solar and Infrared Optical Properties of Glazing Materials and Fading Resistance of Systems. The well-known WINDOW 7.1 computer program can be used in calculating these and other reported optical properties.

As noted above, a limitation of some high shading ability coatings is they reflect more visible light than is optimal. While it is known to anti-reflect the infrared-reflective films in these coatings (e.g., by sandwiching each infrared-reflective film between transparent dielectric films), a tradeoff is sometimes made in high shading ability coatings, whereby the films selected to achieve a low SHGC have the effect of restricting the visible reflectance to a level that is less than ideal. As a consequence, windows bearing these coatings may have a somewhat mirror-like appearance.

To the contrary, the present coating 20 has sufficiently low visible reflectance to obviate this mirror-like appearance problem. For example, the present IG unit 110 has an exterior visible reflectance $R_{exterior}$ of less than about 20%. Preferably, the visible reflectance $R_{exterior}$ of the IG unit 110 is less than about 18%. While the precise level of the IG unit's exterior visible reflectance can be selected and varied in accordance with the present teachings, certain preferred embodiments (e.g., where the coating 20 is one of the film stacks detailed below) achieve an exterior visible reflectance $R_{exterior}$ of about 12-15%.

The term "visible reflectance" is well known in the present art and is used herein in accordance with its well-known meaning to refer to the percentage of all incident visible radiation that is reflected off the exterior side 110E of the IG unit 110. The reported visible reflectance is measured off a central portion of the exterior side 110E of the IG unit 110 and is indicated as $R_{exterior}$.

The present coating 20 provides desirable color properties, particularly given the balance of other properties it achieves. The coating 20 is well suited for applications in which reflected color is of concern. The following discussion of color is reported using the well-known color coordinates of "a" and "b." In particular, these color coordinates are indicated herein using the subscript h (i.e., $a_h$ and $b_h$) to represent the conventional use of the well-known Hunter Lab Color System (Hunter methods/units, Ill. D65, 10 degree observer). The present color properties can be determined as specified in ASTM Method E 308, the entire teachings of which are incorporated herein by reference.

The present IG unit 110 has a desirably neutral appearance in reflection, with any appreciable color being of a pleasing hue. The reflected color reported herein is as viewed from the exterior side 110E of the present IG unit. In some embodiments, the present IG unit 110 exhibits a reflected color characterized by an $a_h$ color coordinate of between −6 and 4, and a $b_h$ color coordinate of between −11 and −3. In one example, the $a_h$ color coordinate of between −4 and 2 (such as about −1.5), and a $b_h$ color coordinate of between −9 and −3 (such as about −4.5). These embodiments represent a broader embodiment group wherein (whether or not $a_h$ and $b_h$ are within the ranges noted above) the present IG unit 110 has an exterior reflected color characterized by a chroma magnitude number (defined as the square root of $[a_h^2+b_h^2]$) of less than 9, preferably less than 7, and perhaps optimally less than 5.

The magnitude of at least one of the $a_h$ and $b_h$ coordinates preferably is negative (in some embodiments, both are negative). In certain embodiments, at least one these color coordinates (e.g., $b_h$) is significantly away (i.e., by at least 2 or at least 4 in magnitude) from the vertical and/or horizontal axes of the color space (i.e., away from the "zero" coordinates). As one approaches the vertical and/or horizontal axes of the color space, a small change in the magnitude of $a_h$ or $b_h$ may translate into a considerable change in terms of actual appearance, the less desirable yellow or red zones being thereby encroached.

The present IG unit 110 can also provide a pleasing transmitted color. Preferably, the IG unit 110 exhibits a transmitted color characterized by an $a_h$ color coordinate of between −10 and 2, and a $b_h$ color coordinate of between −10 and 2. In certain preferred embodiments (e.g., the preferred film stack disclosed herein), the IG unit 110 exhibits a transmitted color characterized by an $a_h$ color coordinate of between −7 and 0 (such as about −3.9), and a $b_h$ color coordinate of between −7 and 0 (such as −3.5). These embodiments represent a broader embodiment group wherein (whether or not the $a_h$ and $b_h$ are within the ranges noted above) the magnitude of at least one (optionally each) of the $a_h$ and $b_h$ coordinates is negative (and optionally has a magnitude of at least 3) for transmitted color.

A first exemplary film stack in accordance with the invention will now be described. This embodiment involves a "double-IR-layer-type" coating. The layers of this coating will be described in order, moving outwardly (i.e., in a direction away from the substrate). Directly upon the substrate, there is formed a layer comprising silicon dioxide. This layer preferably has a thickness of between 100 angstroms and 350 angstroms, perhaps optimally about 130 angstroms. Directly upon this layer there is formed a layer of zinc tin oxide. The thickness of this zinc tin oxide layer is preferably between 70 angstroms and 350 angstroms, perhaps optimally about 230 angstroms. An infrared-reflective silver layer is formed directly upon this zinc tin oxide layer. This silver layer preferably has a thickness of between 75 angstroms and 110 angstroms, perhaps optimally about 85 angstroms. A metallic nickel-aluminum film is then applied directly upon this silver layer. In the present example, the nickel-aluminum layer is deposited as metallic nickel-aluminum film. Some of the nickel-aluminum is oxidized during the deposition of an overlying oxide layer, as described above. This nickel-aluminum blocker film is preferably deposited at a thickness of between 50 angstroms and 90 angstroms, perhaps optimally about 70 angstroms. Directly upon this nickel-aluminum layer is applied a layer of zinc tin oxide, which preferably has a thickness of between 500 angstroms and 900 angstroms, perhaps optimally about 720 angstroms. An infrared-reflective silver layer is formed directly upon this zinc tin oxide layer. This silver layer preferably has a thickness of between 80 angstroms and 140 angstroms, perhaps optimally about 110 angstroms. A metallic nickel-aluminum blocker film is then applied directly upon this silver layer. This nickel-aluminum film preferably is deposited at a thickness of between 30 angstroms and 80 angstroms, perhaps optimally about 55 angstroms. Directly upon this nickel-aluminum film is applied a layer of zinc tin oxide, which preferably has a thickness of between 50 angstroms and 100 angstroms, perhaps optimally about 75 angstroms. Directly upon this zinc tin oxide layer is deposited a layer comprising silicon nitride, which preferably forms the outermost layer of the film stack. Preferably, this silicon nitride layer has a thickness of between 100 angstroms and 300 angstroms, such as about 205 angstroms.

A second exemplary film stack in accordance with the invention will now be described. This embodiment also involves a "double-IR-layer-type" coating. The layers of this coating will be described in order, moving outwardly (i.e., in a direction away from the substrate). Directly upon the substrate, there is formed a layer comprising silicon dioxide. This layer preferably has a thickness of between 100 angstroms and 200 angstroms, perhaps optimally about 125 angstroms. Directly upon this layer there is formed a layer of zinc tin oxide. The thickness of this zinc tin oxide layer is preferably between 100 angstroms and 300 angstroms, perhaps optimally about 220 angstroms. An infrared-reflective silver layer is formed directly upon this zinc tin oxide layer. This silver layer preferably has a thickness of between 75 angstroms and 100 angstroms, perhaps optimally about 85 angstroms. A metallic nickel-aluminum film is then applied directly upon this silver layer. In the present example, the nickel-aluminum layer is deposited as metallic nickel-aluminum film. Some of the nickel-aluminum is oxidized during the deposition of an overlying oxide layer, as described above. This nickel-aluminum blocker film is preferably deposited at a thickness of between 50 angstroms and 70 angstroms, perhaps optimally about 60 angstroms. Directly upon this nickel-aluminum layer is applied a layer of zinc tin oxide, which preferably has a thickness of between 550 angstroms and 850 angstroms, perhaps optimally about 730 angstroms. An infrared-reflective silver layer is formed directly upon this zinc tin oxide layer. This silver layer preferably has a thickness of between 90 angstroms and 130 angstroms, perhaps optimally about 115 angstroms. A metallic nickel-aluminum blocker film is then applied directly upon this silver layer. This nickel-aluminum film preferably is deposited at a thickness of between 30 angstroms and 70 angstroms, perhaps optimally about 50 angstroms. Directly upon this nickel-aluminum film is applied a layer of zinc tin oxide, which preferably has a thickness of between 100 angstroms and 200 angstroms, perhaps optimally about 140 angstroms. Directly upon this zinc tin oxide layer is deposited a layer comprising silicon nitride, which preferably forms the outermost layer of the film stack. Preferably, this silicon nitride layer has a thickness of between 100 angstroms and 300 angstroms, such as about 200 angstroms.

Given the present teaching as a guide, those skilled in the present art would be able to readily select many other suitable layer compositions and thicknesses that are outside these ranges yet produce good results.

Figure 7:
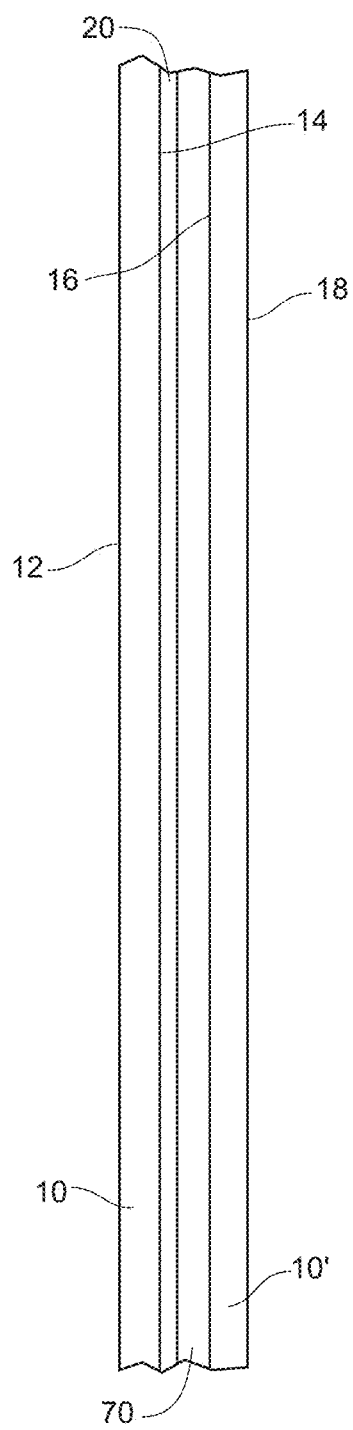
FIG. 7 is a schematic cross-sectional, broken-away view of a laminated glass assembly comprising two panes laminated together with a controlled transmission coating on an inner surface of one of the panes in accordance with still other embodiments of the invention.

The controlled transmission coating 20 is particularly advantageous for use in laminated glass assemblies. The low visible transmission and good selectivity of the coating 20 provide such laminated glass assemblies with good filtering of solar radiation, and the excellent chemical durability offers particular advantage in terms of withstanding corrosion from the cut edges of the laminated glass. FIG. 7 shows one such embodiment wherein two glass panes 10, 10' are laminated together with a polymer interlayer 70 sandwiched between the two panes. Here, the controlled transmission coating 20 is on the second surface 14 of the first pane 10.

One aspect of the invention provides methods of depositing a nickel-aluminum blocker film. The nickel-aluminum film can be deposited by sputter deposition (i.e., sputtering). Sputtering techniques and equipment are well known in the present art. For example, magnetron sputtering chambers and related equipment are available commercially from a variety of sources (e.g., Von Ardenne GmbH, of Dresden, Germany, or Von Ardenne North America, Inc., of Perrysburg, Ohio, USA). Useful magnetron sputtering techniques and equipment are also disclosed in U.S. Pat. No. 4,166,018, issued to Chapin, the teachings of which are incorporated herein by reference.

Figure 8:
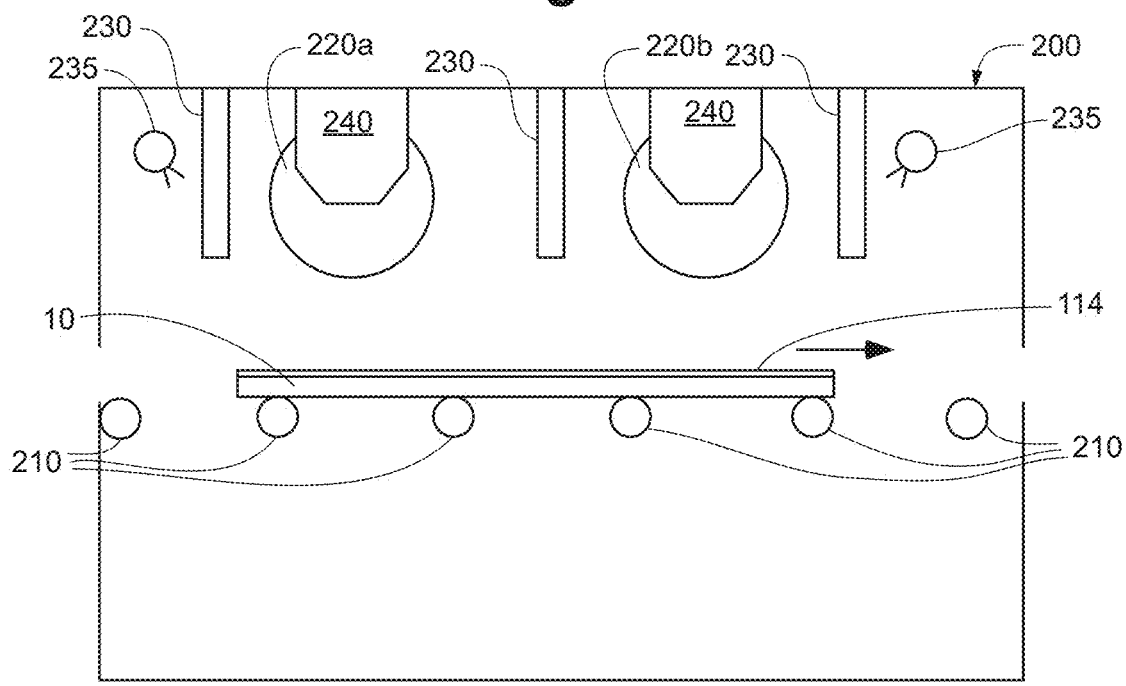
FIG. 8 is a schematic end view of a sputtering chamber that has utility in certain methods of the invention.

Thus, conventional magnetron sputtering techniques and equipment can be used to deposit the nickel-aluminum film. Techniques and equipment of this nature are best understood with reference to FIG. 8, wherein there is illustrated a sputtering chamber 200 equipped with two cathodes. Each cathode includes a sputtering target 220a, 220b, end blocks 240, and a magnet array (not shown) and cooling lines (not shown) within the target. While the illustrated chamber 200 is provided with two cathodes, it may be desirable to employ a single cathode instead. Also shown in FIG. 8 are anodes 230, gas distribution pipes 235, and transport rollers 210 for conveying the substrate 10 through the chamber 200. Sputtering equipment of this nature is well known in the present art.

The sputtering targets 220a, 220b illustrated in FIG. 8 are depicted as being cylindrical magnetron targets (i.e., C-Mags). However, any type of sputtering target (e.g., planar or cylindrical) can be used. For example, the sputtering chamber can alternatively be provided with a single planar target. The selection of appropriate planar and/or cylindrical targets is well within the purview of skilled artisans.

In one method of the invention, a nickel-aluminum layer is deposited by sputtering one or more targets carrying target material comprising an alloy or mixture of nickel and aluminum. For example, the target material may comprise about 90% metallic nickel and about 10% metallic aluminum. The percentages of nickel and aluminum in the target material can be varied as desired. While the target material may consist (or consist essentially) of nickel and aluminum, it is anticipated that the target material may include one or more other materials in addition to nickel and aluminum (such as titanium and/or oxygen). Nickel-aluminum targets can be manufactured by Soleras Advanced Coatings BVBA, of Deinze, Belgium.

In another method of the invention, nickel-aluminum film is deposited by co-sputtering. Co-sputtering is a process in which two or more targets of different composition are sputtered simultaneously. The nickel-aluminum layer can be deposited by co-sputtering a nickel-containing target and an aluminum-containing target in the same sputtering chamber or zone. Thus, one of the targets 220a, 220b in the illustrated chamber 200 may be a nickel-containing target and the other may be an aluminum-containing target. For example, the targets 220a, 220b may be formed respectively of nickel compound (e.g., alloy) and metallic aluminum. Alternatively, the targets 220a, 220b may be formed respectively of a nickel compound and an aluminum compound. Nickel compound targets, as well as aluminum targets and aluminum compound targets, are available from a number of commercial suppliers, such as W.C. Heraeus of Hanau, Germany. The term "nickel-containing" is used herein to refer to any material that contains at least some nickel. The term "aluminum-containing" is used herein to refer respectively to any material that contains at least some aluminum.

Thus, the present co-sputtering method comprises providing a nickel-containing target and an aluminum-containing target. Both targets are positioned in a sputtering chamber having a sputtering cavity in which a controlled environment can be established. One or more power supplies are provided for delivering electric charge (e.g., cathodic charge) to both targets. The cathodes are then energized to sputter nickel and aluminum onto a substrate, thereby depositing the nickel-aluminum layer upon a film layer previously deposited upon the substrate (e.g., onto a previously deposited infrared-reflective layer, beneath which there may be other previously deposited films, as described above). The nickel-containing target and the aluminum-containing target may be sputtered at substantially the same time (e.g., simultaneously) or in succession. A first power level is selected for delivery of electric charge to the nickel-containing target and a second power level is selected for delivery of electric charge to the aluminum-containing target. These power levels are selected to deposit desired percentages of nickel and aluminum. In certain preferred embodiments, the first power level is greater than the second power level.

As can now be appreciated, preferred methods of the invention involve depositing the protective nickel-aluminum layer by sputtering, whether conventionally or by co-sputtering. With continued reference to FIG. 8, there is provided a substrate 10 carrying a partial coating 114 that includes at least one infrared-reflective film. The infrared-reflective film will typically be positioned over a transparent dielectric film, and in most cases will define the outermost face of the partial coating 114 (prior to deposition thereon of the nickel-aluminum film). As will be apparent to those skilled in the art, one or more other films may be formed between the substrate and the transparent dielectric film and/or between the transparent dielectric film and the infrared-reflective film. For example, the partial coating 114 may take the form of the film stack portion beneath, and including, any one of the infrared-reflective films 50, 150 depicted in FIGS. 1-2. In one particular method, the partial coating 114 includes an exposed, outermost infrared-reflective silver or silver-containing film that is carried directly over a transparent dielectric film (e.g., zinc tin oxide or zinc aluminum oxide).

The partially coated substrate 10 is positioned beneath one or more targets 220a, 220b, which comprise both nickel and aluminum (either collectively or individually, depending on whether conventional sputtering or co-sputtering is used). As depicted in FIG. 8, the substrate 10 can be positioned upon a plurality of transport rollers 210. The target or targets are sputtered (i.e., energized) to deposit a nickel-aluminum film upon the partially-coated substrate (in many cases, directly upon the exposed infrared-reflective film). During sputtering, the substrate 10 can be conveyed through the chamber 200 (e.g., continuously and at constant speed). It is well known to drive (i.e., rotate) one or more of the rollers 210 to convey the substrate 10 through the chamber 200 (e.g., in the direction of the arrow shown in FIG. 8).

In some cases, it will be preferred to sputter the nickel-aluminum target or targets in a non-reactive (i.e., inert) atmosphere to deposit the nickel-aluminum film. This would be expected to yield a nickel-aluminum film that is as reactive as possible, thus enabling it to capture a great deal of oxygen and/or nitrogen during deposition of subsequent films and/or during heat treatment. In this regard, a sputtering atmosphere consisting essentially of noble gas (e.g., about 100% argon) may be preferred. For example, argon at a pressure of about $7\times10^{-3}$ mbar (or about 5 mtorr) should give good results. As will be appreciated by skilled artisans, the power used is selected based on the required thickness, the width of the coater, the coating speed, and the number of cathodes involved. Power levels of up to about 25 kW per target have been found to give good results in sputter depositing the nickel-aluminum film. Care should be taken to prevent accidental leakage (flow of reactive gases) into the area where the nickel-aluminum layer is sputtered under control. Any leak near the targets (at low power levels) could create local areas of oxidation in the nickel-aluminum layer. This could create uniformity problems before and after tempering. The substrate 10 upon which the nickel-aluminum layer is deposited can be conveyed through the sputtering chamber 200 at essentially any desired speed. For example, substrate speeds of between about 100-500 inches per minute should be suitable.

While sputtering techniques are presently contemplated to be preferred for depositing the protective nickel-aluminum film and the rest of the coating, any suitable thin film deposition technique(s) can be used. For example, it may be possible to deposit one or more layers of the coating (such as a film comprising silicon dioxide, and/or a film comprising silicon nitride) by plasma chemical vapor deposition (i.e., CVD). Reference is made to U.S. Pat. No. 4,619,729 (Johncock et al.), U.S. Pat. No. 4,737,379 (Hudgens et al.), and U.S. Pat. No. 5,288,527 (Jousse et al.), the teachings of which are incorporated herein by reference. Plasma CVD involves decomposition of gaseous sources via a plasma and subsequent film formation onto solid surfaces, such as glass substrates. The thickness of the resulting film can be adjusted by varying the speed of the substrate as it passes through a plasma zone and by varying the power and gas flow rate within each zone. Those skilled in the art would be able to select other suitable deposition methods for applying the present nickel-aluminum layer.

While some preferred embodiments of the invention have been described, it should be understood that various changes, adaptations and modifications may be made therein without departing from the spirit of the invention and the scope of the appended claims.

What is claimed is:

1. A multiple-pane insulating glazing unit having a between-pane space, the multiple-pane insulating glazing unit comprising a pane having a surface coated with a low-emissivity coating, said surface of said pane being exposed to said between-pane space, the low-emissivity coating comprising, in sequence moving outwardly from said surface of said pane, a dielectric base coat comprising oxide film, nitride film, or oxynitride film, a first infrared-reflective layer, a first nickel-aluminum blocker layer in contact with the first infrared-reflective layer, a dielectric middle coat comprising an oxide film in contact with the first nickel-aluminum blocker layer, a second infrared-reflective layer, a second nickel-aluminum blocker layer in contact with the second infrared-reflective layer, and a dielectric top coat comprising an oxide film in contact with the second nickel-aluminum blocker layer, the first and second infrared-reflective layers each comprising silver, each of the first and second nickel-aluminum blocker layers being devoid of metals other than nickel and aluminum, wherein the low-emissivity coating has only two silver-containing infrared-reflective layers and the multiple-pane insulating glazing unit has a visible transmittance of between 0.3 and 0.5 and a solar heat gain coefficient of less than 0.26, wherein each of the first nickel-aluminum blocker layer and the second nickel-aluminum blocker layer has an outer interface and an inner interface, the outer interface of the first nickel-aluminum blocker layer adheres to said oxide film of the dielectric middle coat while the inner interface of the first nickel-aluminum blocker layer adheres to metallic silver film of the first infrared-reflective layer, the outer interface of the first nickel-aluminum blocker layer comprising aluminum oxide, the inner interface of the first nickel-aluminum blocker layer comprising metallic nickel, the outer interface of the second nickel-aluminum blocker layer adheres to said oxide film of the dielectric top coat while the inner interface of the second nickel-aluminum blocker layer adheres to metallic silver film of the second infrared-reflective layer, the outer interface of the second nickel-aluminum blocker layer comprising aluminum oxide, the inner interface of the second nickel-aluminum blocker layer comprising metallic nickel.

2. The multiple-pane insulating glazing unit of claim 1 wherein one of the first and second nickel-aluminum blocker layers is at least 10% thicker than the other of the first and second nickel-aluminum blocker layers, in combination with each of the first and second nickel-aluminum blocker layers having a thickness of between 40 and 90 angstroms.

3. The multiple-pane insulating glazing unit of claim 1 wherein the first nickel-aluminum blocker layer is more than 10% thicker than the second nickel-aluminum blocker layer.

4. The multiple-pane insulating glazing unit of claim 3 wherein the first nickel-aluminum blocker layer is between 10% and 30% thicker than the second nickel-aluminum blocker layer.

5. The multiple-pane insulating glazing unit of claim 2 wherein the second infrared-reflective layer is thicker than the first infrared-reflective layer, the first infrared-reflective layer has a thickness of between 60 and 110 angstroms, the second infrared-reflective layer has a thickness of between 90 and 130 angstroms, and the visible transmittance of the multiple-pane insulating glazing unit is between 0.35 and 0.45.

6. The multiple-pane insulating glazing unit of claim 5 wherein the dielectric base coat has a total optical thickness of between 500 angstroms and 800 angstroms, the dielectric middle coat has a total optical thickness of between 1,250 angstroms and 1,650 angstroms, and the dielectric top coat has a total optical thickness of between 400 angstroms and 800 angstroms.

7. The multiple-pane insulating glazing unit of claim 1 wherein said pane is a glass sheet having a thickness in a range of 2 mm to 14 mm.

8. The multiple-pane insulating glazing unit of claim 1 wherein the first and second nickel-aluminum blocker layers each contain more than 7.5% aluminum by weight.

9. The multiple-pane insulating glazing unit of claim 1 wherein the first and second infrared-reflective layers each comprise at least 50% silver by weight.

10. The multiple-pane insulating glazing unit of claim 1 wherein the multiple-pane insulating glazing unit has two opposed, external pane surfaces at least one of which is coated with a transparent conductive film.

11. The multiple-pane insulating glazing unit of claim 10 wherein the transparent conductive film comprises both indium and tin.

12. The multiple-pane insulating glazing unit of claim 10 wherein the two opposed, external pane surfaces are coated respectively with first and second transparent conductive films.

13. The multiple-pane insulating glazing unit of claim 12 wherein the first transparent conductive film has a different thickness than the second transparent conductive film.

14. The multiple-pane insulating glazing unit of claim 13 wherein the first transparent conductive film comprises both indium and tin, the second transparent conductive film comprises both indium and tin, wherein the first transparent conductive film has a thickness of from 600 to 900 angstroms, and the second transparent conductive film has a thickness of from 900 to 1,500 angstroms.

15. The multiple-pane insulating glazing unit of claim 12 further comprising a hydrophilic film over the first transparent conductive film, the hydrophilic film comprising titania.

16. The multiple-pane insulating glazing unit of claim 15 wherein the hydrophilic film comprising titania has a thickness of from 20 angstroms to 175 angstroms.

17. A multiple-pane insulating glazing unit having a between-pane space, the multiple-pane insulating glazing unit comprising a pane having a surface coated with a low-emissivity coating, said surface of said pane being exposed to said between-pane space, the low-emissivity coating comprising, in sequence moving outwardly from said surface of said pane, a dielectric base coat comprising oxide film, nitride film, or oxynitride film, a first infrared-reflective layer, a first nickel-aluminum blocker layer in contact with the first infrared-reflective layer, a dielectric middle coat comprising an oxide film in contact with the first nickel-aluminum blocker layer, a second infrared-reflective layer, a second nickel-aluminum blocker layer in contact with the second infrared-reflective layer, and a dielectric top coat comprising an oxide film in contact with the second nickel-aluminum blocker layer, the first and second infrared-reflective layers each comprising silver, each of the first and second nickel-aluminum blocker layers being devoid of metals other than nickel and aluminum, the first nickel-aluminum blocker layer being more than 10% thicker than the second nickel-aluminum blocker layer, each of the first and second nickel-aluminum blocker layers having a thickness of between 40 and 90 angstroms, wherein the low-emissivity coating has only two silver-containing infrared-reflective layers and the multiple-pane insulating glazing unit has a visible transmittance of between 0.3 and 0.5 and a solar heat gain coefficient of less than 0.26, the first nickel-aluminum blocker layer having an outer interface and an inner interface, the outer interface of the first nickel-aluminum blocker layer adheres to said oxide film of the dielectric middle coat while the inner interface of the first nickel-aluminum blocker layer adheres to metallic silver film of the first infrared-reflective layer, the outer interface of the first nickel-aluminum blocker layer comprising aluminum oxide, the inner interface of the first nickel-aluminum blocker layer comprising metallic nickel, the second nickel-aluminum blocker layer having an outer interface and an inner interface, the outer interface of the second nickel-aluminum blocker layer adheres to said oxide film of the dielectric top coat while the inner interface of the second nickel-aluminum blocker layer adheres to metallic silver film of the second infrared-reflective layer, the outer interface of the second nickel-aluminum blocker layer comprising aluminum oxide, the inner interface of the second nickel-aluminum blocker layer comprising metallic nickel.

18. The multiple-pane insulating glazing unit of claim 17 wherein the first nickel-aluminum blocker layer is between 10% and 30% thicker than the second nickel-aluminum blocker layer.

19. The multiple-pane insulating glazing unit of claim 17 wherein the second infrared-reflective layer is thicker than the first infrared-reflective layer, the first infrared-reflective layer has a thickness of between 60 and 110 angstroms, the second infrared-reflective layer has a thickness of between 90 and 130 angstroms, and the visible transmittance of the multiple-pane insulating glazing unit is between 0.35 and 0.45.

20. The multiple-pane insulating glazing unit of claim 19 wherein the dielectric base coat has a total optical thickness of between 500 angstroms and 800 angstroms, the dielectric middle coat has a total optical thickness of between 1,250 angstroms and 1,650 angstroms, and the dielectric top coat has a total optical thickness of between 400 angstroms and 800 angstroms.

21. The multiple-pane insulating glazing unit of claim 17 wherein the first and second nickel-aluminum blocker layers each contain more than 7.5% aluminum by weight.

22. A multiple-pane insulating glazing unit having a between-pane space, the multiple-pane insulating glazing unit comprising a glass pane having a surface coated with a low-emissivity coating, said surface of said glass pane being exposed to said between-pane space, the low-emissivity coating comprising, in sequence moving outwardly from said surface of said glass pane, a dielectric base coat comprising oxide film, nitride film, or oxynitride film, a first infrared-reflective layer, a first nickel-aluminum blocker layer in contact with the first infrared-reflective layer, a dielectric middle coat comprising an oxide film in contact with the first nickel-aluminum blocker layer, a second infrared-reflective layer, a second nickel-aluminum blocker layer in contact with the second infrared-reflective layer, and a dielectric top coat comprising an oxide film in contact with the second nickel-aluminum blocker layer, the first and second infrared-reflective layers each comprising silver, each of the first and second nickel-aluminum blocker layers being devoid of metals other than nickel and aluminum, the first and second nickel-aluminum blocker layers each containing more than 7.5% aluminum by weight, wherein the low-emissivity coating has only two silver-containing infrared-reflective layers and the multiple-pane insulating glazing unit has a visible transmittance of between 0.3 and 0.5 and a solar heat gain coefficient of less than 0.26, the first nickel-aluminum blocker layer having an outer interface and an inner interface, the outer interface of the first nickel-aluminum blocker layer adheres to said oxide film of the dielectric middle coat while the inner interface of the first nickel-aluminum blocker layer adheres to metallic silver film of the first infrared-reflective layer, the outer interface of the first nickel-aluminum blocker layer comprising aluminum oxide, the inner interface of the first nickel-aluminum blocker layer comprising metallic nickel, the second nickel-aluminum blocker layer having an outer interface and an inner interface, the outer interface of the second nickel-aluminum blocker layer adheres to said oxide film of the dielectric top coat while the inner interface of the second nickel-aluminum blocker layer adheres to metallic silver film of the second infrared-reflective layer, the outer interface of the second nickel-aluminum blocker layer comprising aluminum oxide, the inner interface of the second nickel-aluminum blocker layer comprising metallic nickel.

23. The multiple-pane insulating glazing unit of claim 22 wherein each of the first and second nickel-aluminum blocker layers has a thickness of between 40 and 90 angstroms.

24. The multiple-pane insulating glazing unit of claim 23 wherein one of the first and second nickel-aluminum blocker layers is at least 10% thicker than the other of the first and second nickel-aluminum blocker layers.

25. The multiple-pane insulating glazing unit of claim 24 wherein the first nickel-aluminum blocker layer is between 10% and 30% thicker than the second nickel-aluminum blocker layer.

26. The multiple-pane insulating glazing unit of claim 24 wherein the second infrared-reflective layer is thicker than the first infrared-reflective layer, the first infrared-reflective layer has a thickness of between 60 and 110 angstroms, the second infrared-reflective layer has a thickness of between 90 and 130 angstroms, and the visible transmittance of the multiple-pane insulating glazing unit is between 0.35 and 0.45.

27. The multiple-pane insulating glazing unit of claim 26 wherein the dielectric base coat has a total optical thickness of between 500 angstroms and 800 angstroms, the dielectric middle coat has a total optical thickness of between 1,250 angstroms and 1,650 angstroms, and the dielectric top coat has a total optical thickness of between 400 angstroms and 800 angstroms.

* * * * *